(12) United States Patent
Yang et al.

(10) Patent No.: US 11,837,779 B2
(45) Date of Patent: Dec. 5, 2023

(54) ELECTRONIC DEVICE HAVING PHOTO CONDUCTIVE DEVICE COMPRISING PHOTO CONDUCTIVE MEMBER CAPABLE OF ELECTRICALLY CONNECTING PLURALITY OF CONDUCTIVE ELEMENTS

(71) Applicant: Samsung Electronics Co., Ltd., Gyeonggi-do (KR)

(72) Inventors: Dongil Yang, Gyeonggi-do (KR); Jongin Lee, Gyeonggi-do (KR); Hyoseok Na, Gyeonggi-do (KR)

(73) Assignee: Samsung Electronics Co., Ltd

( * ) Notice: Subject to any disclaimer, the term of this patent is extended or adjusted under 35 U.S.C. 154(b) by 390 days.

(21) Appl. No.: 17/288,787

(22) PCT Filed: Oct. 25, 2019

(86) PCT No.: PCT/KR2019/014196
§ 371 (c)(1),
(2) Date: Apr. 26, 2021

(87) PCT Pub. No.: WO2020/085863
PCT Pub. Date: Apr. 30, 2020

(65) Prior Publication Data
US 2022/0013891 A1    Jan. 13, 2022

(30) Foreign Application Priority Data
Oct. 26, 2018 (KR) .................. 10-2018-0129108

(51) Int. Cl.
*H01Q 1/38* (2006.01)
*H01P 1/18* (2006.01)
(Continued)

(52) U.S. Cl.
CPC ............... *H01Q 1/38* (2013.01); *H01P 1/184* (2013.01); *H01P 3/08* (2013.01); *H01Q 1/243* (2013.01); *H01Q 1/48* (2013.01)

(58) Field of Classification Search
None
See application file for complete search history.

(56) References Cited

U.S. PATENT DOCUMENTS

| 5,014,069 A | 5/1991 | Seiler et al. |
| 5,886,670 A | 3/1999 | Manasson et al. |

(Continued)

FOREIGN PATENT DOCUMENTS

| JP | 3062367 | 4/2000 |
| KR | 1020090082135 | 7/2009 |

(Continued)

OTHER PUBLICATIONS

PCT/ISA/210 Search Report issued on PCT/KR2019/014196, dated Feb. 11, 2020, pp. 5.

(Continued)

*Primary Examiner* — Anh Q Tran
(74) *Attorney, Agent, or Firm* — The Farrell Law Firm, P.C.

(57) ABSTRACT

An electronic device, according to one embodiment of the present invention, comprises: an antenna; and a photo conductive device electrically connected to the antenna, wherein the photo conductive device may comprise: a first layer including a plurality of conductive elements disposed to be spaced apart at a specified interval; a second layer disposed above the first layer and including at least one light source capable of outputting light; and a third layer disposed between the first layer and the second layer and having a photo conductive member of which at least a portion is changed, by means of the light, to be conductive in order to (Continued)

electrically connect at least a portion of the plurality of conductive elements. Various other embodiments may be included.

15 Claims, 16 Drawing Sheets

(51) Int. Cl.
    *H01P 3/08*     (2006.01)
    *H01Q 1/24*     (2006.01)
    *H01Q 1/48*     (2006.01)

(56) References Cited

U.S. PATENT DOCUMENTS

| | | |
|---|---|---|
| 6,831,604 B2 | 12/2004 | Obara |
| 7,282,979 B2 | 10/2007 | Tanaka et al. |
| 8,053,732 B2 | 11/2011 | Choi et al. |
| 2007/0281227 A1* | 12/2007 | Maruo .................. G03G 5/0696 430/58.75 |
| 2009/0189826 A1 | 7/2009 | Timofeev et al. |
| 2015/0194542 A1 | 7/2015 | Baik et al. |
| 2018/0226715 A1 | 8/2018 | Neto et al. |
| 2019/0221910 A1* | 7/2019 | Harel ...................... H01P 1/184 |
| 2020/0027663 A1* | 1/2020 | Seong ..................... H01L 31/08 |

FOREIGN PATENT DOCUMENTS

| | | |
|---|---|---|
| KR | 1020100073019 | 7/2010 |
| KR | 1020140041449 | 4/2014 |
| KR | 10201540081149 | 7/2015 |
| KR | 1020180089270 | 8/2018 |
| WO | WO2015149172 | 10/2015 |

OTHER PUBLICATIONS

PCT/ISA/237 Written Opinion issued on PCT/KR2019/014196, dated Feb. 11, 2020, pp. 5.
Korean Office Action dated Jul. 3, 2023 issued in counterpart application No. 10-2018-0129108, 18 pages.

* cited by examiner stub according to an embodiment.
ELECTRONIC DEVICE HAVING PHOTO CONDUCTIVE DEVICE COMPRISING PHOTO CONDUCTIVE MEMBER CAPABLE OF ELECTRICALLY CONNECTING PLURALITY OF CONDUCTIVE ELEMENTS

PRIORITY

This application is a National Phase Entry of International Application No. PCT/KR2019/014196, which was filed on Oct. 25, 2019, and claims priority to Korean Patent Application No. 10-2018-0129108, filed in the Korean Intellectual Property Office on Oct. 26, 2018, the entire content of each of which is incorporated herein by reference.

FIELD

An embodiment of the present disclosure relates to an electronic device having a photo conductive device including a photo conductive member capable of electrically connecting a plurality of conductive elements.

RELATED ART

With the growth of digital technologies, an electronic device is being provided in various forms such as a smart phone, a tablet personal computer (tablet PC), a personal digital assistant (PDA), etc. The electronic device is being developed even in the form of being wearable on a user in order to improve portability and user accessibility. The electronic device can include an antenna for transmitting an electronic wave to a free space or receiving an external electronic wave, and a device (below, a 'frequency adjusting device') for adjusting a resonance frequency of the antenna. As a high-speed wireless communication technology of a high-frequency band is being developed and a frequency band having to be secured in the electronic device becomes wide and various, the number of frequency adjusting devices (e.g., tuners or phase shifters) installed in the electronic device is increasing.

A tuner, a device in which an LC circuit is installed therein, can convert impedance. However, the tuner can have a device characteristic which affects antenna performance. For example, the tuner generates a parasitic component such as resistance caused by the device characteristic or parasitic capacitance, etc. This parasitic component can result in mismatching between impedance of an antenna and impedance of a transmission line and deteriorate the antenna performance. The parasitic component of the tuner can be a small value, but, in high-frequency band communication, this parasitic component can be the main cause of the antenna performance deterioration. A solution to this is to mount an additional device for removing the parasitic component of the tuner, but the securing of a cost and space for mounting this device (e.g., a lump component) can be needed.

In order for a wireless communication system such as satellite communication, broadcasting, mobile communication, terrestrial communication, etc. to suitably operate under a mobile environment, a high-directive satellite array antenna is required. A beamforming system which processes a transmitted or received signal such that energy radiated from the satellite array antenna is concentrated in a specific direction in a space can be used. This beamforming system can include a phase shifter for adjusting a phase for each antenna element of the phase array antenna. However, because the phase shifter is required for each antenna element, a structure can become complex according as the number of arrays is increased. Also, the phase shifter having a fixed electrical length value can be a limit to a design to secure broad and various frequency bands. Also, because the phase shifter merely shifts a phase at several discrete angles, a scheme of changing a phase of a baseband signal at a modem stage or correcting a beam direction and form can be needed for the sake of a sophisticated beam direction and form and, as the number of arrays is increased, a hardware complexity and consumed current regarding this can be accompanied.

An embodiment of the present disclosure can provide an electronic device having a photo conductive device including a photo conductive member capable of electrically connecting a plurality of conductive elements, capable of solving the complexity of a structure while securing performance in changing impedance or shifting a phase.

SUMMARY

An electronic device of an embodiment of the present disclosure can include an antenna, and a photo conductive device electrically connected to the antenna. The photo conductive device can include a first layer including a plurality of conductive elements disposed to be spaced apart at a specified interval, and a second layer disposed above the first layer and including at least one light source capable of outputting light, and a third layer disposed between the first layer and the second layer, and having a photo conductive member of which at least a portion can be changed, by means of the light, to be conductive, and electrically connect at least a portion of the plurality of conductive elements.

A photo conductive device for frequency adjustment of an embodiment of the present disclosure and an electronic device including this can facilitate RF calibration and, when adjusting a frequency of an RF signal supplied to an antenna, decrease its loss.

Besides this, an effect obtainable or expected from various embodiments of the present disclosure is directly or suggestively disclosed in a detailed description of an embodiment of the present disclosure. For instance, various effects expected according to various embodiments of the present disclosure will be disclosed in a detailed description described later.

DETAILED DESCRIPTION

Figure 1:
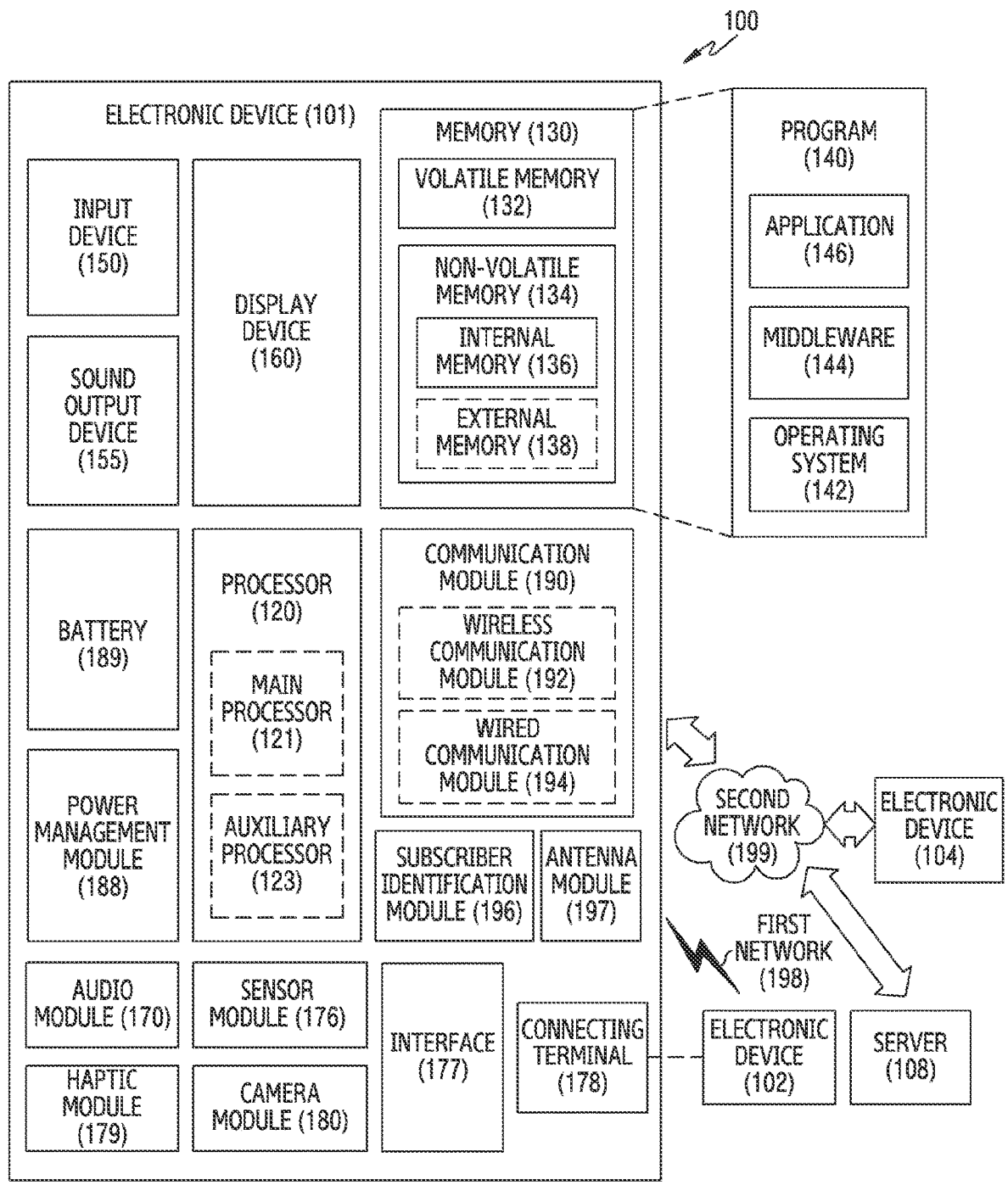
FIG. 1 is a block diagram of an electronic device within a network environment according to an embodiment.

FIG. 1 is a block diagram of an electronic device 101 within a network environment according to an embodiment.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally, or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming call. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high-definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively, or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
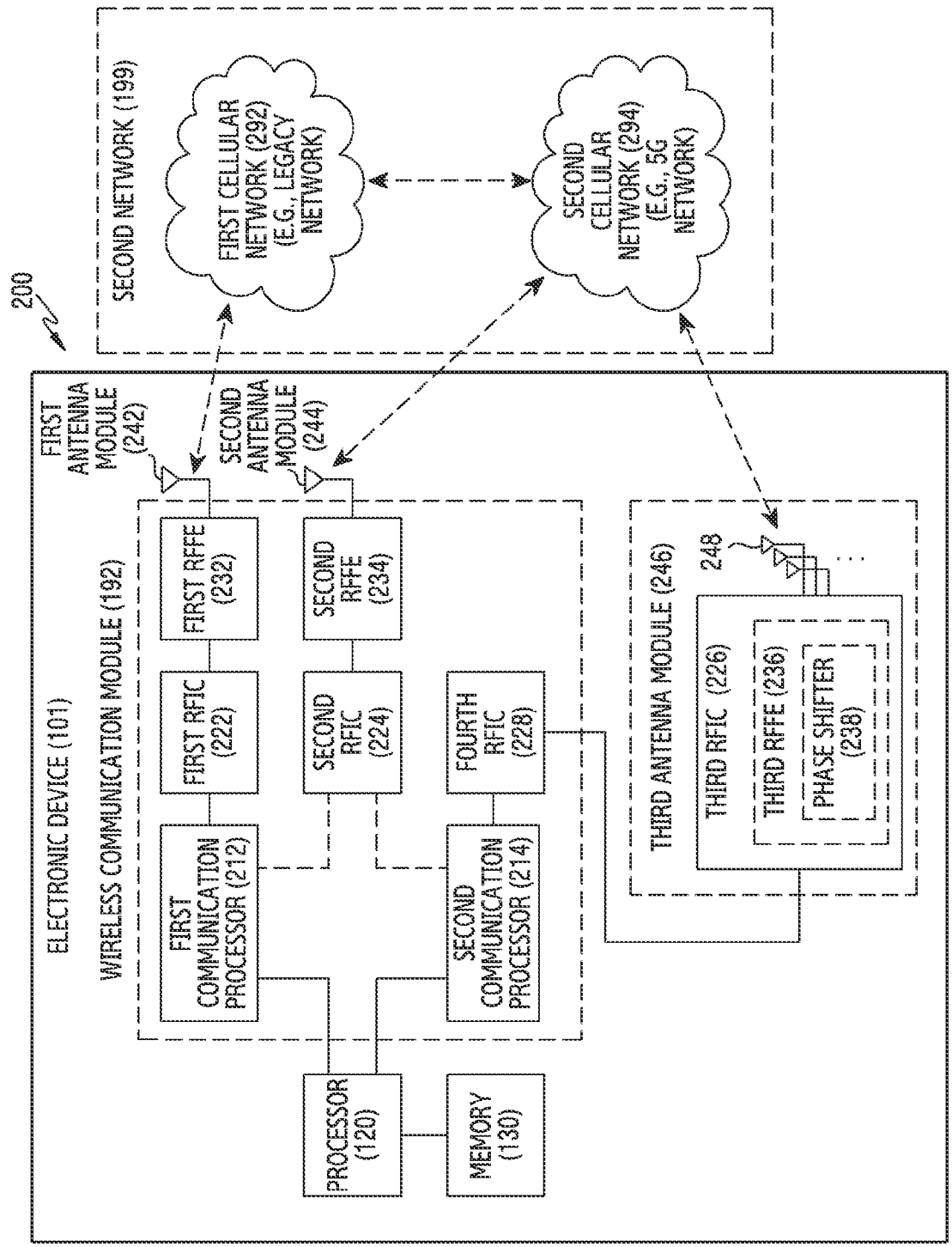
FIG. 2 is a block diagram of an electronic device in a network environment including a plurality of cellular networks according to various embodiments.

FIG. 2 is a block diagram 200 of the electronic device 101 in a network environment including a plurality of cellular networks according to various embodiments.

Referring to FIG. 2, an electronic device 101 may include a first communication processor (e.g., including processing circuitry) 212, a second communication processor (e.g., including processing circuitry) 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include a processor (e.g., including processing circuitry) 120 and a memory 130. The second network 199 may include a first cellular network 292 and a second cellular network 294. According to another embodiment, the electronic device may further include at least one of the parts shown in FIG. 1 and the second network 199 may further include at least one another network. According to an embodiment, the first communication processor 212, the second communication processor 214, the first RFIC 222, the second RFIC 224, the fourth RFIC 228, the first RFFE 232, and the second RFFE 234 may form at least a portion of a wireless communication module 192. According to another embodiment, the fourth RFIC 228 may be omitted or may be included as a portion of the third RFIC 226.

The first communication processor 212 can support establishment of a communication channel with a band to be used for wireless communication with the first cellular network 292 and legacy network communication through the established communication channel. According to various embodiments, the first cellular network may be a legacy network including a 2G, 3G, 4G, or Long-Term Evolution (LTE) network. The second communication processor 214 can support establishment of a communication channel corresponding to a designated band (e.g., about 6 GHz~about 60 GHz) of a band to be used for wireless communication with the second cellular network 294 and 5G network communication through the established communication channel. According to various embodiments, the second cellular network 294 may be a 5G network that is defined in 3GPP. Further, according to an embodiment, the first communication processor 212 or the second communication processor 214 can support establishment of a communication channel corresponding to another designated band (e.g., about 6 GHz or less) of a band to be used for wireless communication with the second cellular network 294 and 5G network communication through the established communication channel. According to an embodiment, the first communication processor 212 and the second communication processor 214 may be implemented in a single chip or a single package. According to various embodiments, the first communication processor 212 or the second communication processor 214 may be disposed in a single chip or a single package together with the processor 120, the auxiliary processor 123, or the communication module 190. According to an embodiment, the first communication processor 212 and the second communication processor 214 is directly or indirectly connected by an interface (not shown), thereby being able to provide or receive data or control signal in one direction or two directions.

The first RFIC 222, in transmission, can converts a baseband signal generated by the first communication processor 212 into a radio frequency (RF) signal of about 700 MHz to about 3 GHz that is used for the first cellular network 292 (e.g., a legacy network). In reception, an RF signal can be obtained from the first cellular network 292 (e.g., a legacy network) through an antenna (e.g., the first antenna module 242) and can be preprocessed through an RFFE (e.g., the first RFFE 232). The first RFIC 222 can covert the preprocessed RF signal into a baseband signal so that the preprocessed RF signal can be processed by the first communication processor 212.

The second RFIC 224 can convert a baseband signal generated by the first communication processor 212 or the second communication processor 214 into an RF signal in a Sub6 band (e.g., about 6 GHz or less) (hereafter, 5G Sub6 RF signal) that is used for the second cellular network 294 (e.g., a 5G network). In reception, a 5G Sub6 RF signal can be obtained from the second cellular network 294 (e.g., a 5G network) through an antenna (e.g., the second antenna module 244) and can be preprocessed through an RFFE (e.g., the second RFFE 234). The second RFIC 224 can convert the processed 5G Sub6 RF signal into a baseband signal so that the processed 5G Sub6 RF signal can be processed by a corresponding communication processor of the first communication processor 212 or the second communication processor 214.

The third RFIC 226 can convert a baseband signal generated by the second communication processor 214 into an RF signal in a 5G Above6 band (e.g., about 6 GHz~about 60 GHz) (hereafter, 5G Above6 RF signal) that is used for the second cellular network 294 (e.g., a 5G network). In reception, a 5G Above6 RF signal can be obtained from the second cellular network 294 (e.g., a 5G network) through an antenna (e.g., the antenna 248) and can be preprocessed through the third RFFE 236. The third RFIC 226 can covert the preprocessed 5G Above6 RF signal into a baseband signal so that the preprocessed 5G Above6 RF signal can be processed by the first communication processor 214. According to an embodiment, the third RFFE 236 may be provided as a portion of the third RFIC 226.

The electronic device 101, according to an embodiment, may include a fourth RFIC 228 separately from or as at least a portion of the third RFIC 226. In this case, the fourth RFIC 228 can convert a baseband signal generated by the second communication processor 214 into an RF signal in an intermediate frequency band (e.g., about 9 GHz~about 11 GHz) (hereafter, IF signal), and then transmit the IF signal to the third RFIC 226. The third RFIC 226 can convert the IF signal into a 5G Above6 RF signal. In reception, a 5G Above6 RF signal can be received from the second cellular network 294 (e.g., a 5G network) through an antenna (e.g., the antenna 248) and can be converted into an IF signal by the third RFIC 226. The fourth RFIC 228 can covert the IF signal into a baseband signal so that IF signal can be processed by the second communication processor 214.

According to an embodiment, the first RFIC 222 and the second RFIC 224 may be implemented as at least a portion of a single chip or a single package. According to an embodiment, the first RFFE 232 and the second RFFE 234 may be implemented as at least a portion of a single chip or a single package. According to an embodiment, at least one of the first antenna module 242 or the second antenna module 244 may be omitted, or may be combined with another antenna module and can process RF signals in a plurality of bands.

According to an embodiment, the third RFIC 226 and the antenna 248 may be disposed on a substrate, thereby being able to form a third antenna module 246. For example, the wireless communication module 192 or the processor 120 may be disposed on a first substrate (e.g., a main PCB). In this case, the third RFIC 226 may be disposed in a partial area (e.g., the bottom) and the antenna 248 may be disposed in another partial area (e.g., the top) of a second substrate (e.g., a sub PCB) that is different from the first substrate, thereby being able to form the third antenna module 246. By disposing the third RFIC 226 and the antenna 248 on the same substrate, it is possible to reduce the length of the transmission line therebetween. Accordingly, it is possible to reduce a loss (e.g., attenuation) of a signal in a high-frequency band (e.g., about 6 GHz~about 60 GHz), for example, which is used for 5G network communication, due to a transmission line. Accordingly, the electronic device 101 can improve the quality and the speed of communication with the second cellular network 294 (e.g., 5G network).

According to an embodiment, the antenna 248 may be an antenna array including a plurality of antenna elements that can be used for beamforming. In this case, the third RFIC 226, for example, as a portion of the third RFFE 236, may include a plurality of phase shifters 238 corresponding to the antenna elements. In transmission, the phase shifters 238 can convert the phase of a 5G Above6 RF signal to be transmitted to the outside of the electronic device 101 (e.g., to a base station of a 5G network) through the respectively corresponding antenna elements. In reception, the phase shifters 238 can convert the phase of a 5G Above6 RF signal received from the outside through the respectively corresponding antenna element into the same or substantially the same phase. This enables transmission or reception through beamforming between the electronic device 101 and the outside.

The second cellular network 294 (e.g., a 5G network) may be operated independently from (e.g., Stand-Along (SA)) or connected and operated with (e.g., Non-Stand Along (NSA)) the first cellular network 292 (e.g., a legacy network). For example, there may be only an access network (e.g., a 5G radio access network (RAN) or a next generation RAN (NG RAN)) and there is no core network (e.g., a next generation core (NGC)) in a 5G network. In this case, the electronic device 101 can access the access network of the 5G network and then can access an external network (e.g., the internet) under control by the core network (e.g., an evolved packed core (EPC)) of the legacy network. Protocol information (e.g., LTE protocol information) for communication with a legacy network or protocol information (e.g., New Radio (NR) protocol information) for communication with a 5G network may be stored in the memory 230 and accessed by another part (e.g., the processor 120, the first communication processor 212, or the second communication processor 214).

Figure 3:
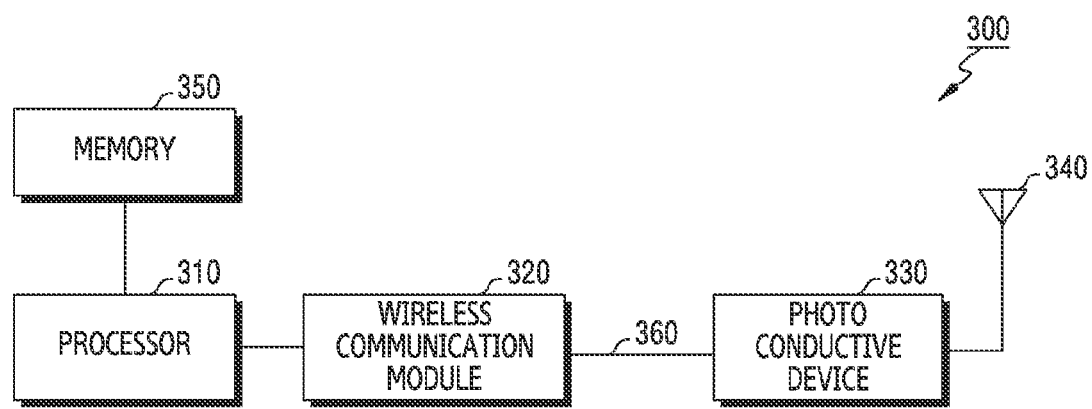
FIG. 3 is a block diagram of an electronic device including a photo conductive device for frequency adjustment according to an embodiment.
Figure 4:
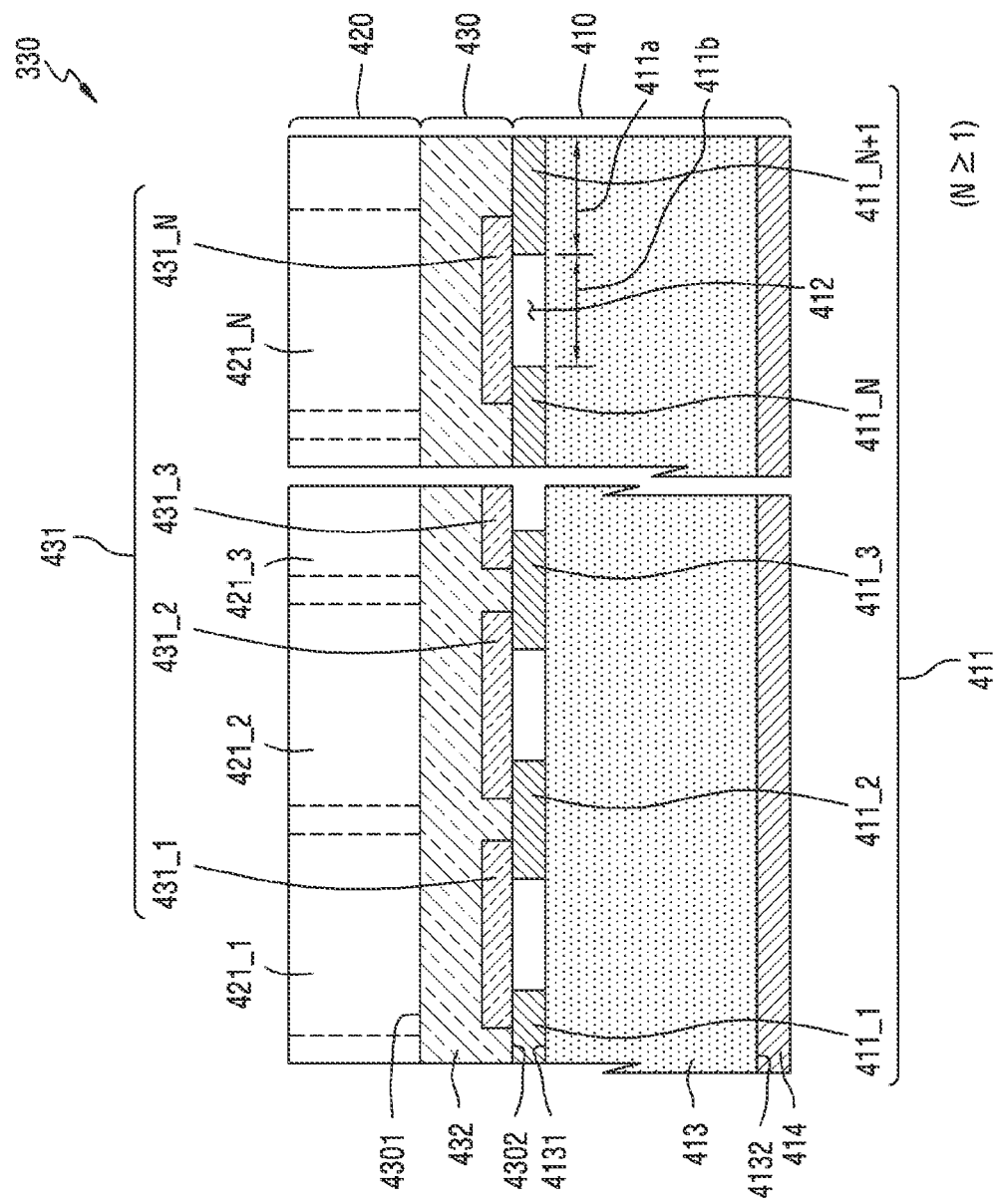
FIG. 4 is a cross section of the photo conductive device of FIG. 3.

FIG. 3 is a block diagram of an electronic device including a photo conductive device for frequency adjustment according to an embodiment. FIG. 4 is a cross section of the photo conductive device of FIG. 3 according to an embodiment.

Referring to FIG. 3, the electronic device 300 (e.g., the electronic device 101 of FIG. 1 or 2) can include at least one of a processor 301 (e.g., the processor 120 of FIG. 1 or 2), a wireless communication module 320 (e.g., the wireless communication module 192 of FIG. 1 or 2), at least one photo conductive device 330, at least one antenna 340 (e.g., the antenna module 197 of FIG. 1 or the antenna of FIG. 2), or a memory 350 (e.g., the memory 130 of FIG. 1 or 2).

According to an embodiment, the processor 310 can control general operations of the electronic device 300. For example, the processor 310 can transmit and/or receive a signal through the wireless communication module 320. The processor 310 can write data in the memory 350, or read. The processor 310 can perform functions of a protocol stack required in the communication standard. A portion of the wireless communication module 320, and/or the processor 310, can be denoted as a communication processor (CP).

According to an embodiment, the wireless communication module 320 can perform functions for transmitting and/or receiving a signal through a wireless channel. For example, the wireless communication module 320 can perform a function of conversion between a baseband signal and a bit stream in compliance with the physical layer standard of a system. For example, at data transmission, the wireless communication module 320 can provide complex symbols by encoding and modulating a transmission bit stream. Also, at data reception, the wireless communication module 320 can restore a reception bit stream by demodulating and decoding a baseband signal. The wireless communication module 320 can up-convert a baseband signal into a radio frequency (RF) band signal and then transmit through at least one antenna 340, and down-convert an RF band signal received through the at least one antenna 340 into a baseband signal. For example, the wireless communication module 320 can include a transmission filter, a reception filter, an amplifier, a mixer, an oscillator, a digital to analog converter (DAC), an analog to digital converter (ADC), etc.

According to various embodiments, the wireless communication module 320 can include a plurality of communication modules in order to process signals of mutually different frequency bands. According to various embodiments, the wireless communication module 320 can include the plurality of communication modules in order to support mutually different many wireless access technologies. For example, the mutually different wireless access technologies can include Bluetooth low energy (BLE), wireless fidelity (Wi-Fi), WiFi gigabyte (WiGig), a cellular network (e.g., long term evolution (LTE)), etc. Also, the mutually different frequency bands can include a super high frequency (SHF) (e.g., 2.5 GHz and 5 GHz) band, and/or a millimeter (mm) wave (e.g., 60 GHz) band.

According to an embodiment, the wireless communication module 320 can include a baseband processor or at least one communication circuit (e.g., an intermediate frequency integrated circuit (IFIC) or a radio frequency integrated circuit (RFIC)). The wireless communication module 320, for example, can include a baseband processor separate from the processor 310 (e.g., an application processor (AP)).

According to an embodiment, the wireless communication module 320 can be electrically connected to the at least one antenna 340 via a transmission line 360. The transmission line 360, a structure for forwarding a frequency signal (voltage, current), can be a conductor system which uses an action of the forwarding of a wave by an electrical parameter (resistance per unitary length, inductance, conductance, capacitance).

According to an embodiment, the at least one antenna 340 can be a converter which forwards an electromagnetic wave from the transmission line 360 to the free space or from the free space to the transmission line 360, and can transmit or receive electromagnetic wave energy in a direction and polarization suitable to purpose. A reflection characteristic and impedance of the at least one antenna 340 can be related to antenna performance, and be various according to an antenna shape and size, and antenna materials. A radiation characteristic of the at least one antenna 340 can include an antenna radiation pattern (or an antenna pattern) which is a directive function indicating a relative distribution of power radiated from the antenna, and a polarization state (or antenna polarization) of an electronic wave radiated from the antenna. The antenna impedance can be related to power forwarding from a transmitter to the antenna or power forwarding from the antenna to a receiver. To minimize reflection in a transmission line 360 and antenna connection portion, the antenna impedance can be designed to match with impedance of the transmission line and, due to this, maximal power forwarding (or power loss minimization) or efficient signal forwarding through the antenna can be possible. This impedance matching can lead to an efficient signal flow at a specific frequency.

The at least one photo conductive device 330, for example, can be connected to the transmission line 360, and can change its electrical length which is used for adjusting a frequency according to the control of the wireless communication module 320 or the processor 310 in order to support a corresponding communication mode. The electrical length can denote an electrical wavelength unitary length of a line or device compared to a wavelength to a frequency intended to be used by the electronic device 300. The electrical length can denote a value dividing a physical length by a wavelength ($\lambda$). According to some embodiment, the electrical length (or phase length) can denote a length of a conductive pattern (or an electrical conductor) with respect to a phase shift which is shown by transmission through a conductor at a specific frequency. According to various embodiments, the electrical length can be various according to the length of the conductive pattern which can be formed by the at least one photo conductive device 330, a breadth (or a width), a wideness (or an area) or its form.

According to an embodiment, the at least one photo conductive device 330 can adjust (or shift) a phase of an RF signal supplied to the at least one antenna 340. For example, the photo conductive device 330 can be implemented as the phase shifter 238 of FIG. 2. According to various embodiments, the at least one photo conductive device 330 can move a resonance frequency of the at least one antenna 340 to a specified frequency or move the resonance frequency of the at least one antenna 340 as much as specified.

Referring to FIG. 4, in an embodiment, the at least one photo conductive device 330 can include a first layer 410 including a plurality of conductive elements 411 disposed to be spaced apart at a specified interval, a second layer 420 disposed above the first layer 410 and including at least one light source capable of outputting light, and a third layer 430 disposed between the first layer 410 and the second layer 420 and having a photo conductive member 431 of which at least a portion is changed, by means of the light outputted from the second layer 420, to be conductive. In response to the at least portion of the photo conductive member 431 being changed, at least a portion of the plurality of conductive elements 411 of the first layer 410 can be electrically connected through the portion changed to be conductive among the photo conductive member 431. According to an embodiment, in response to the at least one light source included in the second layer 420 being controlled, an electrical length of the photo conductive device 330 is determined, and the determined electrical length can be used for frequency adjustment.

According to an embodiment, the first layer 410 can include a dielectric layer 413 which includes a first surface 4131 facing the third layer 430, and a second surface 4132 facing away from the first surface 4131, and the plurality of conductive elements 411 can be disposed on the first surface 4131. The at least portion of the plurality of conductive elements 411 can have the same breadth 411a or, according to some embodiment, can have a mutually different breadth as well. Gaps 411b between at least portions of the plurality of conductive elements 411 can be identical or, according to some embodiment, can be mutually different as well.

According to an embodiment, the plurality of conductive elements 411 of the first layer 410 can be disposed in the dielectric layer 413 by using semiconductor manufacture etching or redistribution layer (RDL) forming.

According to an embodiment, the photo conductive device 330 can be formed on the basis of a printed circuit board. For example, the first layer 410 can be formed by a structure of fixing the plurality of conductive elements 411 and a ground plane 414 by the dielectric layer 413 on the basis of copper clad laminates (CCL) (or a disc). For example, the first layer 410 having the plurality of conductive elements 411 and the ground plane 414 can be formed through a series of flows such as circuit printing, copper foil etching, resist peeling-off, etc., on the basis of the copper clad laminates. The copper clad laminates are laminates used for a printed circuit, and can include a structure of attaching copper foils to both surfaces of several insulating material substrates (e.g., resin) and an insulating layer (e.g., the dielectric layer 413). The insulating layer of the copper clad laminates, for example, can include a resin such as phenol or epoxy, etc. The copper clad laminates can further include a reinforcement substrate such as a paper, a glass fiber or a glass nonwoven, etc. This reinforcement substrate can enhance a rigidity (e.g., a perpendicular and horizontal rigidity) of the insulating layer insufficient by only the resin, or decrease a dimensional variation of the insulating layer dependent on a temperature.

The copper clad laminate, for example, can be a glass-epoxy copper clad laminate which includes a substrate impregnating (or infiltrating) an epoxy resin into a glass fiber, and copper foils coupled to this. According to an embodiment, in national electrical manufacturers association (NEMA), the copper clad laminate is divided by grades such as flame retardant (FR)-1, FR-2, FR-3, FR-4 FR-5 or FR-6, etc., on the basis of the substrate and a flame resistance (or flame retardancy), and the glass-epoxy copper clad laminate can be one of FR-4 and FR-5. According to an embodiment, FR-4 or FR-5 can include a substrate in which woven glass fibers impregnating the epoxy resin are stacked together, and a copper foil coupled to these.

The copper clad laminate, for example, can be a paper-phenol copper clad laminate which includes a substrate impregnating a phenol resin into a paper, and copper foils coupled to this. According to an embodiment, the paper-phenol copper clad laminate can be one of flame retardant (FR)-1, FR-2 or FR-3 classified in NEMA.

The copper clad laminate, for example, can be a composite copper clad laminate made by combining two or more kinds of reinforcement substrates. According to an embodiment, the composite copper clad laminate can include a composite type of laminate material bonded with a flame retardant epoxy resin (CEM)-1 or CEM-3, etc. defined in NEMA. CEM-1 can include a center substrate (or a core) consisting of a paper impregnating an epoxy resin, and an outer substrate consisting of a woven glass fiber impregnating the epoxy resin, and a copper foil coupled to the outer substrate. CEM-3 can include a center substrate consisting of a non-woven glass fiber (e.g., a glass nonwoven) impregnating the epoxy resin, and an outer substrate consisting of a woven glass fiber impregnating the epoxy resin, and a copper foil coupled to the outer substrate. The glass fiber or the paper can improve mechanical machinability, heat resistance or dimensional stability. According to some embodiment, the copper clad laminate can be FR-6 which includes a center substrate consisting of a non-woven glass fiber (e.g., a glass nonwoven) impregnating a polyester resin, an outer substrate consisting of a glass fiber impregnating the resin, and a copper foil coupled to the outer substrate as well.

According to various embodiments, the copper clad laminate can be a high-frequency copper clad laminate made with materials capable of corresponding to high-speed signal transmission. For example, a propagation speed of a signal is inversely proportional to a dielectric constant of material in a printed circuit board, so the propagation speed of the signal can be increased in response to using material of a low dielectric constant.

According to some embodiment, the copper clad laminate can be a form of disposing a film prepreg of an insulation material on a plate formed of a metal such as aluminum or iron and thereafter coupling a copper foil to the film prepreg as well.

According to some embodiment, the copper clad laminate can include a flexible copper clad laminate (FCCL) for a flexible printed circuit board (FPCB), etc. as well. The flexible copper clad laminate, for example, can be a form of coupling a polyester film having flexibility or a polyimide film, etc. and a copper foil by an adhesive.

According to an embodiment, the photo conductive device 330 can be included in a printed circuit board in which at least one of the processor 310, the wireless communication module 320 or the memory 350 of FIG. 3 is mounted. According to some embodiment, the photo conductive device 330 can be included in a printed circuit board in which at least one antenna 340 of FIG. 3 is disposed. The printed circuit board can be separate from a printed circuit board in which at least one of the wireless communication module 320 or the memory 350 is mounted.

According to an embodiment, the third layer 430 can include a third surface 4301 coupled to face the second layer 420, and a fourth surface 4302 facing the first layer 410. The plurality of conductive elements 411 of the first layer 410 can be disposed between the first surface 4131 of the first layer 410 and the fourth surface 4302 of the third layer 430, and can be coupled to the fourth surface 4302 of the third layer 430.

According to an embodiment, the photo conductive member 431 of the third layer 430 can include a plurality of photo conductive elements 431_1, 431_2, 431_3, . . . , 431_N disposed to be spaced apart at a specified interval. The photo conductive element 431_N can include a photo conductive material such as Si, and can form a portion of the fourth surface 4302 of the third layer 430. The photo conductive element 431_N can be in physical contact with mutually adjacent at least two conductive elements 411_N and 411_N+1. In response to the photo conductive element 431_N being changed to be conductive by means of light outputted from the light source of the second layer 420, the at least two conductive elements 411_N and 411_N+1 being in physical contact with the photo conductive element 431_N can be electrically connected through the photo conductive element 431_N changed to be conductive.

According to an embodiment, there can be voids 412 between the plurality of conductive elements 411, between the first layer 410 and the third layer 430. According to various embodiments, the photo conductive element 431_N can be extended to occupy the voids 412 between the plurality of conductive elements 411. According to various embodiments, the voids 412 between the plurality of conductive elements 411 can be filled with an insulating material such as $SiO_2$ as well.

According to an embodiment, the photo conductive member 431 can be formed by forming a photo conductive layer (or a photo conductive plate) by various deposition methods such as physical vapor deposition (PVD), chemical vapor deposition (CVD) or sputtering and thereafter etching this.

According to an embodiment, the third layer 430 can include an insulating member 432 which includes materials such as $SiO_2$ filling between the photo conductive elements 431_1, 431_2, 431_3, . . . , 431_N. A portion of the insulating member 432 can be disposed between the plurality of photo conductive elements 431_1, 431_2, 431_3, . . . , 431_N and form a portion of the fourth surface 4302. The insulating member 432 can form the third surface 4301 which is bonded with the second layer 420. The insulating member 432, for example, can be formed by using various deposition methods such as sputtering. According to an embodiment, the insulating member 432 can include a light transparent material, and light outputted from the second layer 420 can pass through the insulating member 432 and be forwarded to the photo conductive member 431.

According to various embodiments, the third layer 430 can be formed by a structure which includes an array consisting of a plurality of photo switches (or photo-electric switches) replacing the photo conductive member 431 as well. For example, by replacing the plurality of photo conductive elements 431_1, 431_2, 431_3, . . . , 431_N, the plurality of photo switches can be disposed in the third layer 430 correspondingly to the plurality of light sources 421_1, 421_2, 421_3, . . . , 421_N. In response to at least a portion of the plurality of photo switches being turned on, at least a portion of the plurality of conductive elements 411 of the first layer 410 can be electrically connected through the turned-on at least portion of the plurality of photo switches.

According to an embodiment, the second layer 420 can include the plurality of light sources (or light source cells) 421_1, 421_2, 421_3, . . . , 421_N aligned with the plurality of photo conductive elements 431_1, 431_2, 431_3, . . . , 431_N of the third layer 430.

According to an embodiment, the light source 421_N can include a light emitting diode (LED) device (or chip), and the LED device used as the light source 421_N can be embedded in the second layer 420.

For example, in response to coupling two electrodes (below, diodes) to one surface of a first substrate (not shown) by using deposition, etc., a second substrate in which a plurality of LED devices are coupled to the first substrate can be formed. The first substrate can be a thin plate (e.g., a wafer) which includes a material formed of a single element or a material formed of at least two or more elements and becomes the foundation of making a semiconductor device. The LED device is a semiconductor device which includes a diode and an N-type material and P-type material within the diode, and can output light of various wavelengths according to the kind of a material used in a semiconductor. In response to cutting the second substrate, the plurality of LED devices can be separated. The LED device can include contacts and, in response to a current being supplied to the contacts, the LED device can emit light. After the plurality of LED devices are disposed in a light transparent plate, a wiring layer (e.g., a re-distribution layer (RDL)) electrically connected with the contacts of the LED device can be formed. According to various embodiments, one surface of the light transparent plate can include recesses capable of disposing the LED devices. A minute pattern of the wiring layer can be electrically connected with the LED device and a control circuit (e.g., the processor 310 or the wireless communication module 320 of FIG. 3). According to an embodiment, the LED device can receive a low or high signal from the control circuit through the wiring layer and thus be turned On or Off. According to some embodiment, the LED device can be connected to a power supply unit through the wiring layer, and the control circuit can control the LED devices through decoding logic gates between the LED devices and the control circuit. The power supply unit can be implemented in the form of a current mirror which is connected with a DC-DC converter supplying a DC voltage or a low dropout voltage regulator (LDO) and supplies a predetermined voltage. An interface between the control circuit and the LED devices can be implemented by a mobile industry processor interface (MIPI) or a digital interface corresponding to this.

According to various embodiments, the LED device used for the light source 421_N can be a micro LED device. For example, the micro LED device can be an LED device which is a hexahedron having a length, a breadth and a height and which is designed in length, breadth or height at about 200 μm or less. In some embodiment, the micro LED device can be an LED device designed to have a volume of about 200×200×200 μm$^3$. In some embodiment, at least one of the length, the breadth and the height of the micro LED device can be designed to be 100 μm or less. For example, a length×breadth size of the micro LED device can be about 5 μm×5 μm. Although a shape or size of the micro LED device all cannot be enumerated, its deformation can be various according to convergence trend. According to various embodiments, a light emitting device possible to replace the micro LED device can be defined as a 'micro light emitting device'.

According to various embodiments, the light sources 421_1, 421_2, 421_3, . . . , 421_N can be formed by using organic light emitting diodes (OLED) capable of emitting light by themselves or a quantum dot (e.g., a semiconductor crystal of a few nanometers (nm) capable of emitting light by itself) as well. The second layer 420 can be formed to include various other light sources besides this.

According to an embodiment, the photo conductive device 330 can include a bonding layer disposed between the second layer 420 and the third layer 430, and the bonding layer can include various materials such as organic matter or polymer.

In an embodiment, referring to FIGS. 3 and 4, in response to the processor 310 controlling the light sources 421_1, 421_2, 421_3, . . . , 421_N included in the second layer 420, an electrical length of the photo conductive device 330 can be determined. The electrical length determined by the photo conductive device 330 can shift a phase of an RF signal supplied to the at least one antenna 340, or move a resonance frequency of the at least one antenna 340 to a specified frequency, or move as much as specified.

According to an embodiment, the wireless communication module 320 can include many transmitting and/or receiving paths. The at least one antenna 340 can include an antenna array including many antenna elements. The wireless communication module 320 can include a beamforming system which processes a transmitted or received signal wherein energy radiated from the antenna element is concentrated in a specific direction in a space. The beamforming system can allow to receive a signal of a greater intensity in a desired direction or forward a signal in a desired direction, or can allow not to receive a signal coming from an undesired direction. The beamforming system can adjust the form and direction of a beam by using a difference of an amplitude or phase of a carrier signal at an RF band. According to an embodiment, in the beamforming system, the wireless communication module 320 can determine a phase for each antenna element by using the photo conductive device 330. According to an embodiment, in the beamforming system, the wireless communication module 320 can control to have a phase difference for each antenna element. For example, when assuming that the at least one antenna 340 includes a first antenna element and a second antenna element, the wireless communication module 320 can include a first electrical path electrically connected with a first point on the first antenna element, and a second electrical path electrically connected with a second point on the second antenna element. The processor 310 or the wireless communication module 320 can control at least one photo conductive device 330, and offer a phase difference between a first signal at the first point and a second signal at the second point.

According to an embodiment, the memory 350 (e.g., the memory 130 of FIG. 1 or FIG. 2) can store setting values on the light sources 421_1, 421_2, 421_3, . . . , 421_N of the photo conductive device 330. The processor 310 can control the light sources 421_1, 421_2, 421_3, . . . , 421_N of the photo conductive device 330 on the basis of the setting values stored in the memory 350.

According to an embodiment, the setting values on the light sources 421_1, 421_2, 421_3, . . . , 421_N of the photo conductive device 330 can be determined to implement impedance matching or set beamforming through RF calibration. The determined setting values can be stored and updated in the memory 350.

According to an embodiment, the memory 350 can store codebook information on beamforming. The processor 310 or the wireless communication module 320 can efficiently control many beams through the at least one antenna 340 on the basis of the codebook information.

Figure 5A:
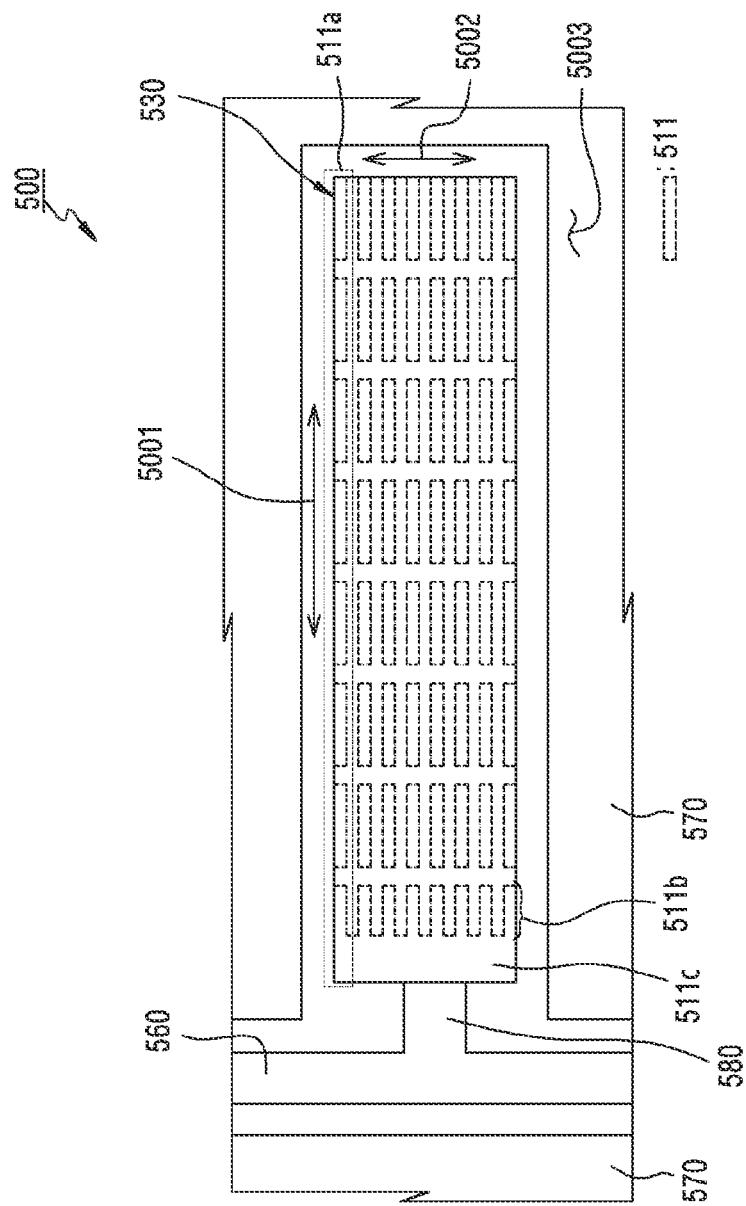
FIG. 5A illustrates a printed circuit board including a photo conductive device according to an embodiment.
Figure 5B:
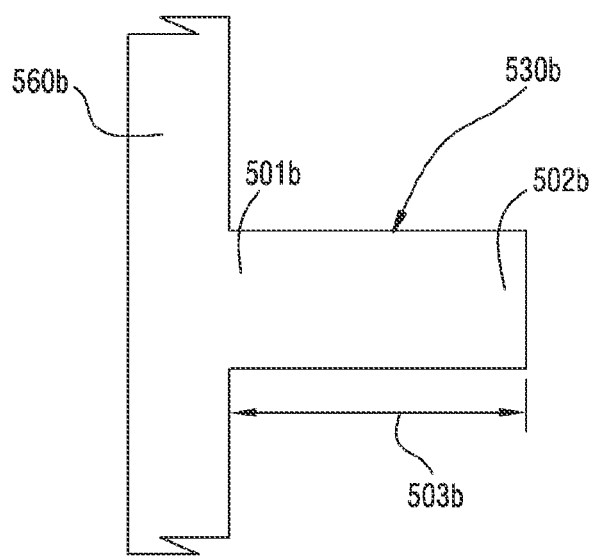
FIG. 5B schematically illustrates a structure of an open stub according to an embodiment.
Figure 5C:
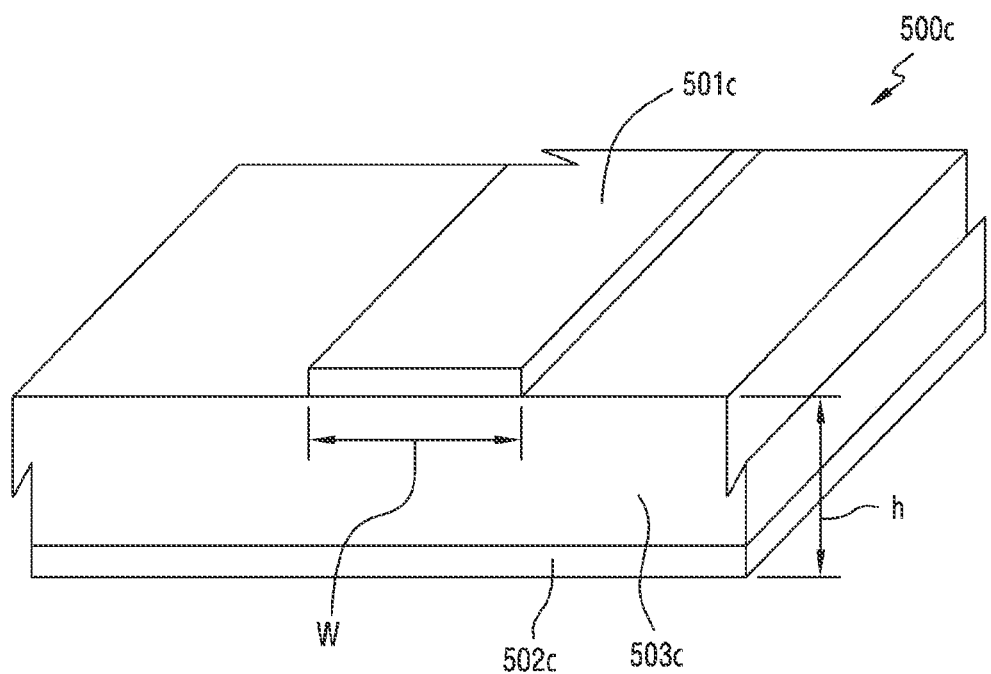
FIG. 5C is a diagram for describing parameters on a stub according to an embodiment.

FIG. 5A illustrates a printed circuit board including a photo conductive device according to an embodiment. FIG. 5B schematically illustrates a structure of an open stub according to an embodiment. FIG. 5C is a diagram for describing parameters on a stub according to an embodiment.

Referring to FIG. 5A, in an embodiment, the printed circuit board 500 can include a transmission line 560 (e.g., the transmission line 360 of FIG. 3), and a photo conductive device 530 electrically connected to the transmission line 560. According to an embodiment, the photo conductive device 530 can include a plurality of conductive elements 511 disposed in one surface 5003 of the printed circuit board 500. According to an embodiment, a ground plane 570 can be disposed in one surface 5003 of the printed circuit board 500, and the plurality of conductive elements 511 and the transmission line 560 can be disposed in a region not occupied by the ground plane 570.

According to an embodiment, the plurality of conductive elements 511 can include a plurality of rows disposed in a first direction 5001. The photo conductive device 530 can include an end pattern 511c electrically connecting a first row 511b disposed adjacently with the transmission line 560 among the plurality of rows. For example, the first row 511b and the end pattern 511c can be formed integrally. The printed circuit board 500 can include a connection pattern 580 electrically connecting the transmission line 560 and the end pattern 511c. According to various embodiments, the connection pattern 580 can be prepared plurally between the transmission line 560 and the end pattern 511c as well.

According to an embodiment, the photo conductive device 530 can include a second layer (e.g., the second layer 420 of FIG. 4) which is disposed above the plurality of conductive elements 511 and includes at least one light source. The photo conductive device 530 can include a third layer (e.g., the third layer 430 of FIG. 4) which has a photo conductive member (e.g., the photo conductive member 431 of FIG. 4) disposed between the plurality of conductive elements 511 and the second layer. At least a portion of the photo conductive member can be changed to be conductive by means of light outputted from the second layer. In response to the at least portion of the photo conductive member being changed to be conductive, at least a portion of the plurality of conductive elements 511 can be electrically connected through the portion changed to be conductive among the photo conductive member.

According to an embodiment, the photo conductive device 530 can be implemented by the open stub which is designed on the basis of a microstrip. For example, the microstrip can be a structure in which a first conductor and a second conductor (e.g., the ground plane 414 of FIG. 4) having a greater width than the first conductor are disposed to interpose a dielectric material layer (e.g., the dielectric layer 413 of FIG. 4) therebetween. According to an embodiment, the first conductor can include the portion changed to be conductive among the photo conductive member, and the at least portion of the plurality of conductive elements 511 electrically connected by this, and can be used as a branch line (e.g., an open stub) connected in parallel to the transmission line 560. An electrical length of the first conductor can be used for frequency adjustment (e.g., a phase shift and/or a resonance frequency movement), and can be determined in response to at least one light source included in the second layer (e.g., the second layer 420 of FIG. 4) being controlled.

In an embodiment, referring to FIG. 5B, the open stub 530b (e.g., in FIG. 5A, the portion changed to be conductive among the photo conductive member and the at least portion of the plurality of conductive elements 511 electrically connected by this) can be a form including one end part 501b which is connected to a transmission line 560b (e.g., the transmission line 560 of FIG. 5A) and the other end part 502b which is extended from the one-end part 501 and is in an open state. Input impedance which is an electrical parameter of the open stub 530b for the transmission line 560b can be various according to a length 503b of the open stub 530b. Equation 1 and Equation 2 below relate to input impedance of the open stub 530b.

$$Z_{in} = -jZ_o \cot \beta l \qquad \text{[Equation 1]}$$

($Z_{in}$: input impedance, l: length, β: phase constant [rad/m])

$$\beta = 2\pi/\lambda_g \quad \text{[Equation 2]}$$

($\lambda_g$: wavelength on transmission line)

Referring to Equations 1 and 2, when the length 503b of the open stub 530b is less than λ/4, the open stub 530b operates as a capacitor and, when the length 503b of the open stub 530b is greater than λ/4 and is less than λ/2, the open stub 530b operates as an inductor. In response to the length 503b of the open stub 530b being λ/4, 3λ/4, 5λ/4, etc., the open stub 530b can operate even as a band elimination filter (BEF). Referring to FIG. 5A, the first conductor including the portion changed to be conductive among the photo conductive member and the at least portion of the plurality of conductive elements 511 electrically connected by this can have a conceptual structure such as the open stub 530b defined with reference to FIG. 5B, and can offer an electrical parameter such as resistance, inductance, capacitance, etc. to the transmission line 560.

In an embodiment, referring to FIG. 5C, the printed circuit board 500c (e.g., the photo conductive device of FIG. 5A) can include a structure of fixing a first conductor 501c and a second conductor (e.g., a ground plane) 502c (e.g., the ground plane 414 of FIG. 4) having a greater width than the first conductor 501c by a dielectric material 503c (e.g., the dielectric layer 413 of FIG. 4). The first conductor 501c supported in parallel with respect to the second conductor 502c can be used as an open stub. Equation 3, Equation 4, Equation 5 and Equation 6 below relate to parameters on a design of the first conductor 501c.

$$E_e = \frac{E_r + 1}{2} + \frac{E_r - 1}{2} \frac{1}{\sqrt{1 + 12h/W}} \quad \text{[Equation 3]}$$

($E_e$: effective dielectric constant,
$E_r$: relative dielectric constant)

$$Z_0 = \sqrt{\frac{L}{C}} = \sqrt{\frac{LC}{C}} = \frac{1}{V_p C} = \frac{\sqrt{E_r}}{cC} \quad \text{[Equation 4]}$$

($Z_0$: impedance,
c = 3 * 108 m/sec,
L: inductance,
C: capacitance,
$V_p$: peak value,
$E_r$: relative dielectric constant)

$$Z_0 = \frac{30}{\sqrt{E_e}} \ln\left(\frac{8h}{W} + \frac{W}{4h}\right) \quad W/h \leq 1 \quad \text{[Equation 5]}$$

$$Z_0 = \frac{120\pi}{\sqrt{Ee}\,[W/h + 1.393 + 0.667\,\ln(W/h + 1.444)]} \quad W/h \geq 1 \quad \text{[Equation 6]}$$

Referring to Equation 3, Equation 4, Equation 5 and Equation 6, in response to a width (W) of the first conductor 501c being increased, an inductance of the first conductor 501c can decrease and a capacitance of the first conductor 501c can increase. In response to the width (W) of the first conductor 501c being decreased, the inductance of the first conductor 501c can increase and the capacitance of the first conductor 501c can decrease. In response to the relative dielectric constant (Er) being increased, the capacitance of the first conductor 501c can increase and in response to the relative dielectric constant (Er) being decreased, the capacitance of the first conductor 501c can decrease. In response to a height (h) of the dielectric substance 503c being increased, the inductance of the first conductor 501 can increase and the capacitance of the first conductor 501c can decrease. In response to the height (h) of the dielectric substance 503c being decreased, the inductance of the first conductance 501 can decrease and the capacitance of the first conductor 501c can increase. The impedance of the first conductor 501c can be different according to the width (W) of the first conductor 501c. For example, in response to the width (W) of the first conductor 501c being increased, the impedance of the first conductor 501c can decrease and in response to the width (W) of the first conductor 501c being decreased, the impedance of the first conductor 501c can increase. By considering this, a control method for at least a portion of the printed circuit board 500 including the photo conductive device 530 of FIG. 5A, and at least one light source of the photo conductive device 530 can be designed.

Referring to FIG. 5A, in an embodiment, the plurality of conductive elements 511 can include an array 511a disposed at a specified interval in the first direction 5001. By controlling at least one light source of the second layer (e.g., the second layer 420 of FIG. 4), a first physical length (e.g., the length 503b of FIG. 5B) in the first direction 5001 using the array 511a can be determined. In response to the first physical length using the array 511a being increased, a resistance or insertion loss can increase. According to an embodiment, in response to disposing the array 511a plurally in a second direction 5002 orthogonal to the first direction 5001, and controlling the at least one light source of the second layer (e.g., the second layer 420 of FIG. 4) and extending a second physical length in the second direction 5002, the resistance or insertion loss can be reduced.

According to an embodiment, in response to the at least one light source included in the second layer (e.g., the second layer 420 of FIG. 4) being controlled, an electrical length of the photo conductive device 530 can be determined. The determined electrical length of the photo conductive device 530 can shift a phase of an RF signal supplied to at least one antenna (e.g., at least one antenna 340 of FIG. 3) connected to the transmission line 560, or move a resonance frequency of the at least one antenna to a specified frequency or move as much as specified. The electrical length (or phase length) can denote a length of a conductive pattern with respect to a phase shift which is shown by transmission through a conductor at a specific frequency. According to various embodiments, the electrical length can be various according to a physical length (e.g., the first physical length) of the conductive pattern (or electrical conductor) which can be formed by the photo conductive device 530, a breadth (e.g., the second physical length), a width (e.g., a width having the first physical length and the second physical length) or its form.

According to various embodiments, in accordance with a communication mode using a corresponding frequency band, the photo conductive device 530 can be controlled wherein various conductive patterns connected to the transmission line 560 are formed.

According to some embodiment, though not illustrated, a conductor (or a conductive path) which includes the portion changed to be conductive among the photo conductive member in the photo conductive device 530 and the at least portion of the plurality of conductive elements 511 electrically connected by this can be formed by a short stub which is a structure being connected in parallel to the transmission line 560 while being shorted at its far end as well.

According to various embodiments (not shown), the photo conductive device 530 can be prepared as a plural number connected to the transmission line 560.

According to various embodiments, though not illustrated, the conductor (or the conductive path) which is formed by the portion changed to be conductive among the photo conductive member in the photo conductive device 530 and the at least portion of the plurality of conductive elements 511 electrically connected by this can be formed to be connected in series to the transmission line 560 as well.

Figure 6A:
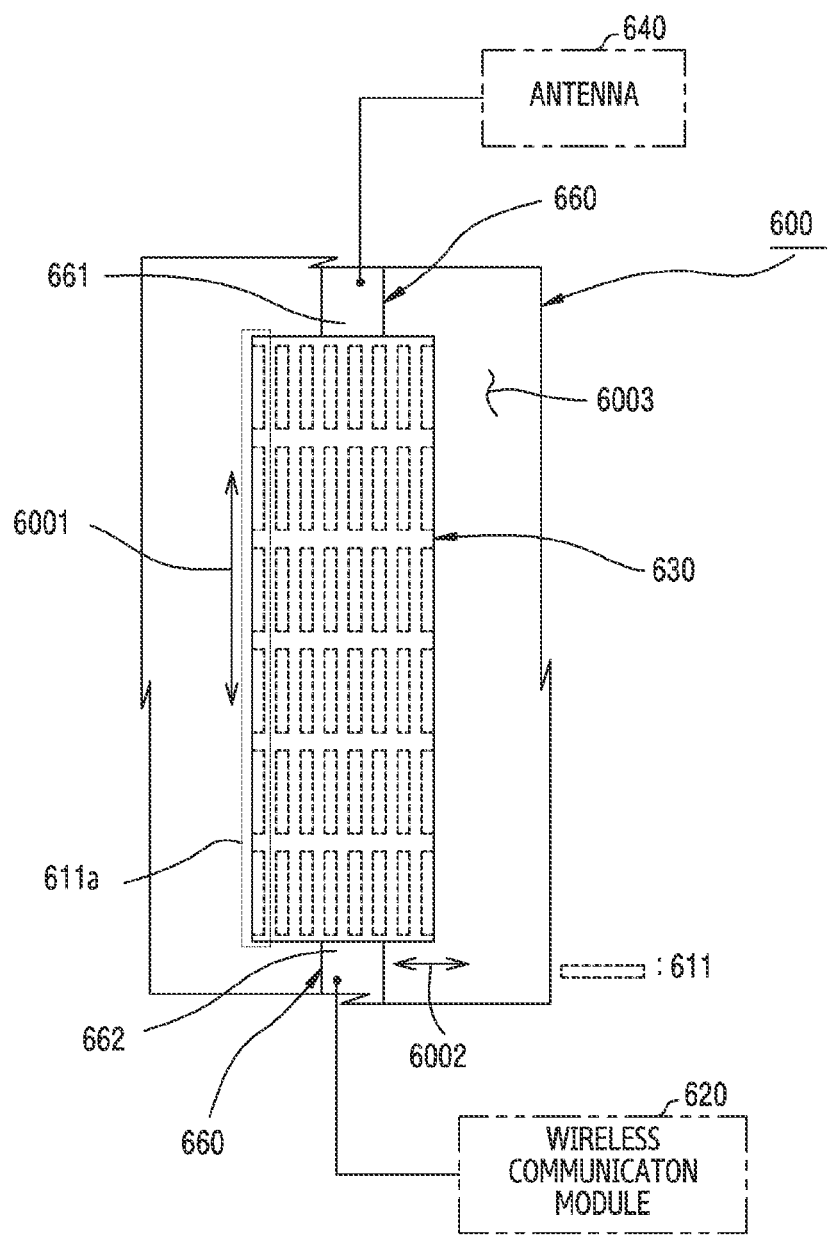
FIG. 6A illustrates a printed circuit board including a photo conductive device according to an embodiment.
Figure 6B:
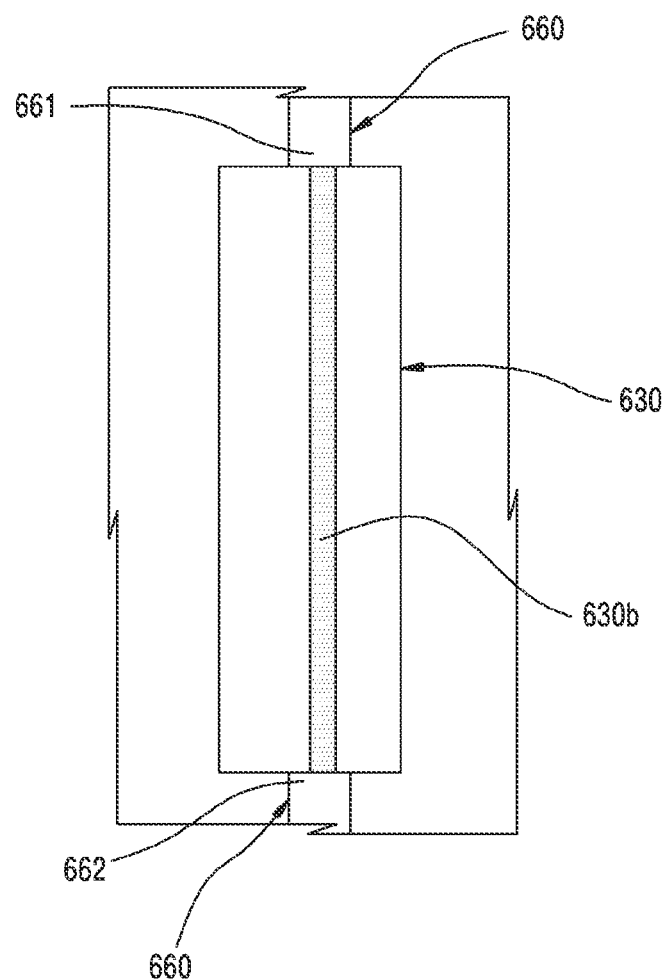
FIGS. 6B and 6C illustrate conductive patterns capable of being formed in a photo conductive device according to various embodiments.
Figure 6C:
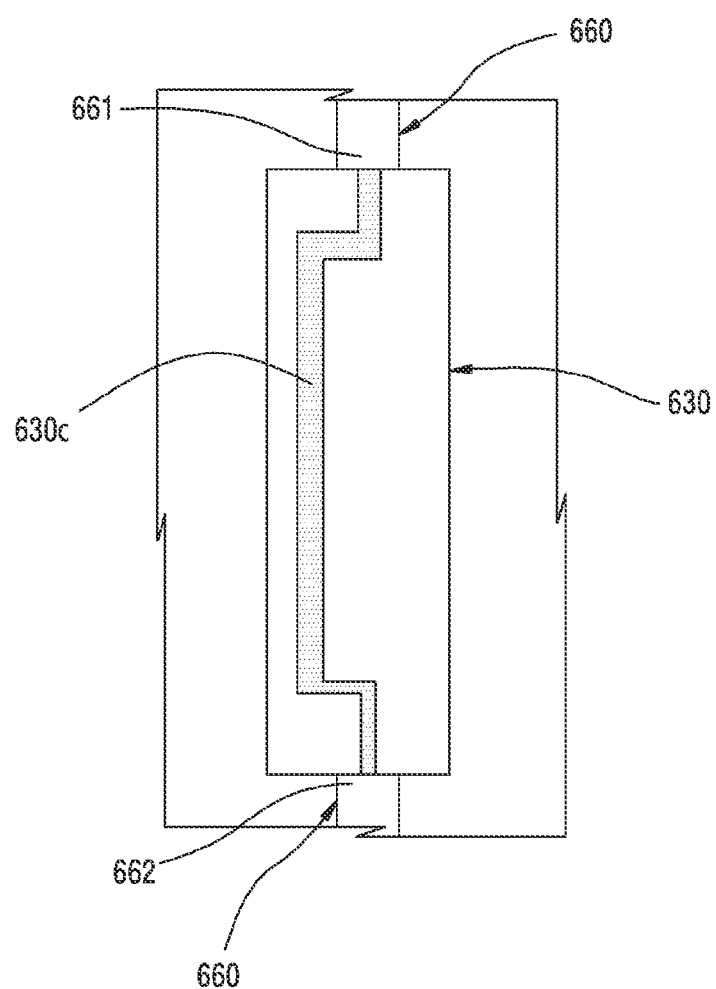

FIG. 6A illustrates a printed circuit board including a photo conductive device according to an embodiment. FIGS. 6B and 6C illustrate conductive patterns capable of being formed in a photo conductive device according to various embodiments.

Referring to FIG. 6A, in an embodiment, the printed circuit board 600 can include a transmission line 660 (e.g., the transmission line 360 of FIG. 3), and a photo conductive device 630 electrically connected to the transmission line 660. According to an embodiment, the transmission line 660 can be disposed between at least one antenna 640 (e.g., at least one antenna 340 of FIG. 3) and a wireless communication module 620 (e.g., the wireless communication module 320 of FIG. 3), and the photo conductive device 630 can connect one end part 661 of the transmission line 660 and the other end part 662.

According to an embodiment, the photo conductive device 630 can include a plurality of conductive elements 611 disposed in one surface 6003 of the printed circuit board 600.

According to an embodiment, the plurality of conductive elements 611 can include an array 611a which will be disposed at a specified interval in a first direction 6001. The array 611a can be disposed plurally in a second direction 6002 orthogonal to the first direction 6001. According to an embodiment, the photo conductive device 630 can include a second layer (e.g., the second layer 420 of FIG. 4) which is disposed above the plurality of conductive elements 611 and includes at least one light source. The photo conductive device 630 can include a third layer (e.g., the third layer 430 of FIG. 4) having a photo conductive member (e.g., the photo conductive member 431 of FIG. 4) disposed between the plurality of conductive elements 611 and the second layer, and at least a portion of the photo conductive member can be changed to be conductive by means of light outputted from the second layer. In response to the at least portion of the photo conductive member being changed to be conductive, at least a portion of the plurality of conductive elements 611 can be electrically connected through the portion changed to be conductive among the photo conductive member.

According to an embodiment, the photo conductive device 630 can be implemented on the basis of a microstrip. For example, the microstrip can be a structure in which a first conductor and a second conductor (e.g., the ground plane 414 of FIG. 4) having a greater width than the first conductor are disposed to interpose a layer (e.g., the dielectric layer 413 of FIG. 4) of a dielectric material therebetween. According to an embodiment, the first conductor can include the portion changed to be conductive among the photo conductive member and the at least portion of the plurality of conductive elements 611 electrically connected by this, and can be used as a line connected in series to the transmission line 660. An electrical length of the first conductor can be used for frequency adjustment (e.g., phase shift and/or resonance frequency shift), and can be determined in response to at least one light source included in the second layer (e.g., the second layer 420 of FIG. 4) of the photo conductive device 630 being controlled.

In an embodiment, by controlling the at least one light source of the second layer (e.g., the second layer 420 of FIG. 4), a conductive pattern in which the at least portion of the plurality of conductive elements 611 connects the one end part 661 of the transmission line 660 and the other end part 662 can be formed. An electrical length of the conductive pattern can be determined according to a physical length of the conductive pattern, a breadth, a width or its form. The electrical length of the conductive pattern can shift a phase of an RF signal supplied to at least one antenna 640 connected to the transmission line 660, or move a resonance frequency of the at least one antenna 640 to a specified frequency, or move as much as specified.

Referring to FIG. 6B, in an embodiment, in a communication mode using a first frequency band, the photo conductive device 630 can be controlled wherein a conductive pattern 630b connecting the one end part 661 of the transmission line 660 and the other end part 662 is formed in a straight line form.

Referring to FIG. 6C, in various embodiments, in a communication mode using a second frequency band, the photo conductive device 630 can be controlled wherein a conductive pattern 630c connecting the one end part 661 of the transmission line 660 and the other end part 662 is formed in a form different from the straight line form shown in FIG. 6B. According to various embodiments, in accordance with a communication mode using at least one frequency band, the photo conductive device 630 can be controlled wherein conductive patterns of various different forms connecting the one end part 661 of the transmission line 660 and the other end part 662 are formed. According to various embodiments, in a corresponding communication mode, the photo conductive device 630 can be controlled wherein a plurality of conductive patterns connecting the one end part 661 of the transmission line 660 and the other end part 662 are formed.

Figure 7:
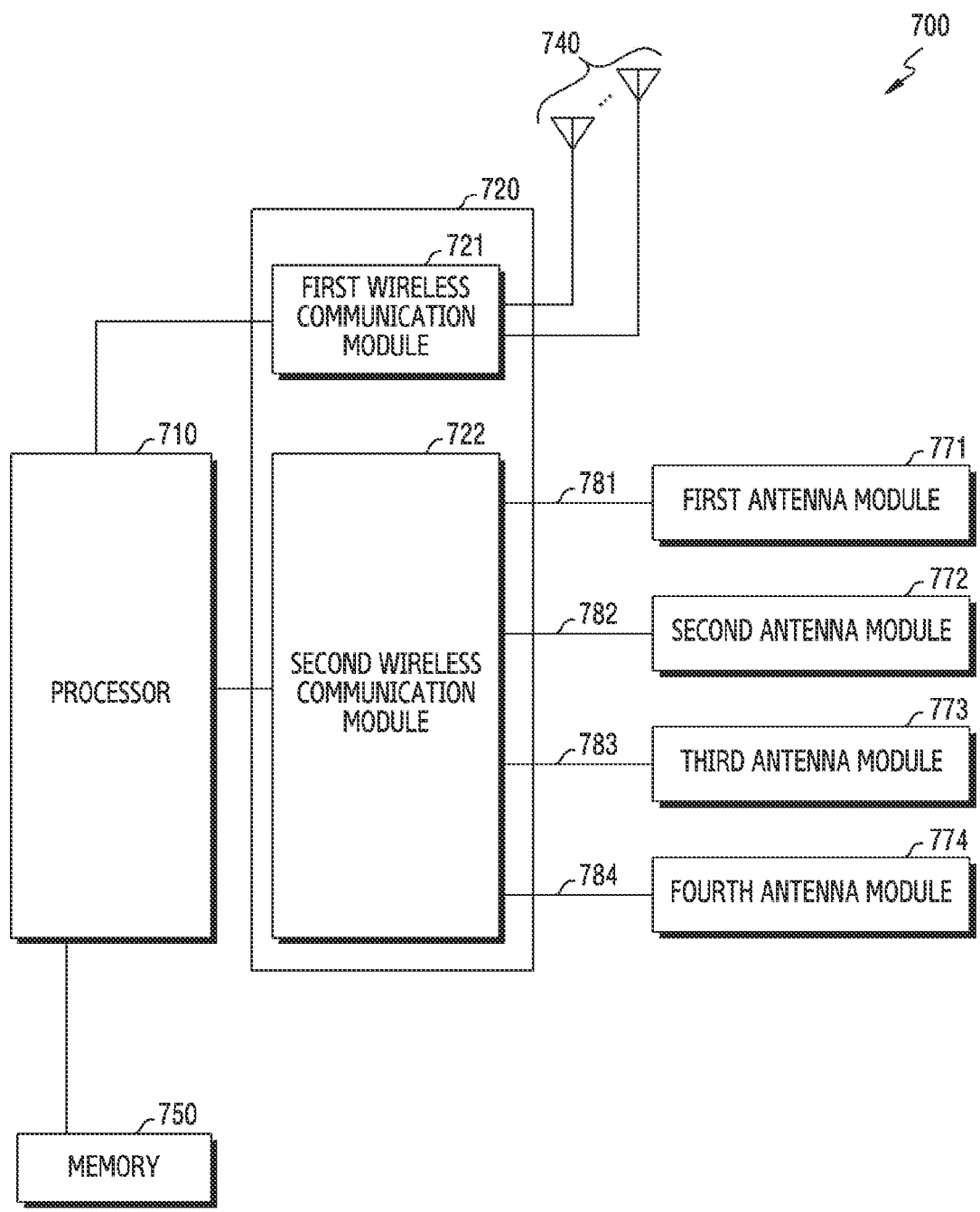
FIG. 7 is a block diagram of an electronic device including a photo conductive device for frequency adjustment according to an embodiment.

FIG. 7 is a block diagram of an electronic device including a photo conductive device for frequency adjustment according to an embodiment.

Referring to FIG. 7, the electronic device 700 (e.g., the electronic device 101 of FIG. 1 or 2) can include at least one of a processor 710 (e.g., the processor 120 of FIG. 1 or 2 or the processor 310 of FIG. 3), a wireless communication module 720 (e.g., the wireless communication module 192 of FIG. 1 or 2 or the wireless communication module 320 of FIG. 3), a first antenna module 771, a second antenna module 772, a third antenna module 773, a fourth antenna module 774, or a memory 750 (e.g., the memory 130 of FIG. 1 or 2 or the memory 350 of FIG. 3).

According to an embodiment, the processor 710 can execute software and control at least one another component (e.g., a hardware or software component) of the electronic device 700 connected to the processor 710, and can perform various data processing or operations. According to an embodiment, the processor 710 can process a command or data stored in the memory 750.

According to an embodiment, the wireless communication module 720 can be electrically connected to the first antenna module 771 through a first electrical connection member 781, and be electrically connected to the second antenna module 772 through a second electrical connection member 782, and be electrically connected to the third antenna module 773 through a third electrical connection member 783, and be electrically connected to the fourth antenna module 774 through a fourth electrical connection member 784. The wireless communication module 720, for example, can include a baseband processor or at least one communication circuit (e.g., an intermediate frequency integrated circuit (IFIC) or a radio frequency integrated circuit (RFIC)). The wireless communication module 720, for example, can include a baseband processor separate from the processor 710 (e.g., an application processor (AP)).

According to some embodiment, at least one of the first electrical connection member 781, the second electrical connection member 782, the third electrical connection member 783 or the fourth electrical connection member 784 can include various conductive paths such as a flexible printed circuit board or a coaxial cable.

According to an embodiment, the wireless communication module 720 can include at least one of the first wireless communication module 721 or the second wireless communication module 722. The electronic device 700 can further include one or more interfaces for supporting inter-chip communication between the wireless communication module 720 and the processor 710. The processor 710 and the first wireless communication module 721 or second wireless communication module 722 can transmit or receive data by using the inter processor communication channel.

According to an embodiment, the first wireless communication module 721 or the second wireless communication module 722 can offer an interface for performing communication with other entities. The first wireless communication module 721, for example, can support wireless communication for a first network (not shown) which uses one or more antennas 740. The second wireless communication module 722, for example, can support wireless communication for a second network (not shown) which uses the first antenna module 771, the second antenna module 772, the third antenna module 773 or the fourth antenna module 774.

According to an embodiment, the first network (not shown) or the second network (not shown) can include the network 199 of FIG. 1. According to an embodiment, the first network can include a 4th generation (4G) network, and the second network can include a 5th generation (5G) network. The 4G network, for example, can support a long term evolution (LTE) protocol which is stipulated in 3GPP. The 5G network, for example, can support a new radio (NR) protocol which is stipulated in 3GPP. According to various embodiments, the first network can be related with wireless fidelity (WiFi) or a global positioning system (GPS) as well.

According to an embodiment, the first wireless communication module 721 can receive a high frequency signal (below, a radio frequency (RF) signal) for the first network (e.g., the 4G network) through the one or more antennas 740, and modulate (e.g., down-convert) the received RF signal into a low frequency signal (below, a baseband signal) and transmit to the processor 710. The first wireless communication module 721 can receive a baseband signal for the first network from the processor 710, and modulate (e.g., up-convert) the received baseband signal into an RF signal, and transmit to the external through the one or more antennas 740. According to an embodiment, the first wireless communication module 721 can include a radio frequency integrated circuit (RFIC). According to various embodiments, an input of a local oscillator (LO) can be used when an RF signal is modulated into a baseband signal or a baseband signal is modulated into an RF signal.

According to an embodiment, the second wireless communication module 722 can receive a baseband signal for the second network from the processor 710. By using an input (below, an LO signal) of the local oscillator, the second wireless communication module 722 can up-convert the baseband signal into an IF signal, and transmit the IF signal to the antenna modules 771, 772, 773 and 774 through the electrical connection members 781, 782, 783 and 784. The antenna modules 771, 772, 773 and 774 can receive an IF signal from the wireless communication module 720 through the electrical connection members 781, 782, 783 and 784. By using an LO signal, the antenna modules 771, 772, 773 and 774 can up-convert the IF signal into an RF signal, and transmit the RF signal to the external through a plurality of antenna elements (not shown) included in the antenna modules 771, 772, 773 and 774.

According to an embodiment, the antenna modules 771, 772, 773 and 774 can include a plurality of antennas (not shown), and can receive an RF signal through the plurality of antennas. By using an LO signal, the antenna modules 771, 772, 773 and 774 can down-convert the RF signal into an IF signal, and transmit the IF signal to the second wireless communication module 722 through the electrical connection members 781, 782, 783 and 784. The second wireless communication module 722 can receive an IF signal from the antenna modules 771, 772, 773 and 774 through the electrical connection members 781, 782, 783 and 784. By using an LO signal, the second wireless communication module 722 can down-convert the IF signal into a baseband signal, and transmit the baseband signal to the processor 710.

According to an embodiment, the second wireless communication module 722 can include an intermediate frequency integrated circuit (IFIC). The second wireless communication module 722 can transmit and/or receive a first signal of a frequency band between about 5 GHz to about 15 GHz.

According to an embodiment, at least one of the first antenna module 771, the second antenna module 772, the third antenna module 773 or the fourth antenna module 774 can include an RFIC. The at least one of the first antenna module 771, the second antenna module 772, the third antenna module 773 or the fourth antenna module 774 can transmit and/or receive a second signal of at least a partial band (e.g., a frequency band of about 24 GHz to about 100 GHz, a frequency band of about 24 GHz to about 30 GHz, or a frequency band between about 37 GHz to about 40 GHz) among about 6 GHz to about 100 GHz.

According to various embodiments, the first antenna module 771, the second antenna module 772, the third antenna module 773 or the fourth antenna module 774 can be disposed adjacently (e.g., within about 10 mm) with a side bezel structure of the electronic device 700 (e.g., a lateral member forming a lateral surface of the electronic device), and decrease electromagnetic interference caused by peripheral factors.

According to an embodiment, the first antenna module 771 can include at least one first photo conductive device (e.g., the photo conductive device 330 of FIG. 4, the photo conductive device 530 of FIG. 5A, or the photo conductive device 630 of FIG. 6A). According to an embodiment, in response to at least one light source included in the at least one first photo conductive device being controlled by the processor 710, an electrical length of the at least one first photo conductive device can be determined and, by this, a phase for a plurality of antenna elements included in the first antenna module 771 can be adjusted (or shifted). The memory 750 (e.g., the non-volatile random access memory 134 of FIG. 1) can store a setting value for the at least one light source included in the at least one first photo conductive device. On the basis of the setting value, the processor 710 can control the at least one light source.

According to an embodiment, the second antenna module 772 can include at least one second photo conductive device (e.g., the photo conductive device 330 of FIG. 4, the photo conductive device 530 of FIG. 5A, or the photo conductive device 630 of FIG. 6A). According to an embodiment, in response to at least one light source included in the at least one second photo conductive device being controlled by the processor 710, an electrical length of the at least one second photo conductive device can be determined and, by this, a phase for a plurality of antenna elements included in the second antenna module 772 can be adjusted (or shifted). The memory 750 can store a setting value for the at least one light source included in the at least one second photo conductive device. On the basis of the setting value, the processor 710 can control the at least one light source.

According to an embodiment, the third antenna module 773 can include at least one third photo conductive device (e.g., the photo conductive device 330 of FIG. 4, the photo conductive device 530 of FIG. 5A, or the photo conductive device 630 of FIG. 6A). According to an embodiment, in response to at least one light source included in the at least one third photo conductive device being controlled by the processor 710, an electrical length of the at least one third photo conductive device can be determined and, by this, a phase for a plurality of antenna elements included in the third antenna module 773 can be adjusted (or shifted). The memory 750 can store a setting value for the at least one light source included in the at least one third photo conductive device. On the basis of the setting value, the processor 710 can control the at least one light source.

According to an embodiment, the fourth antenna module 774 can include at least one fourth photo conductive device (e.g., the photo conductive device 330 of FIG. 4, the photo conductive device 530 of FIG. 5A, or the photo conductive device 630 of FIG. 6A). According to an embodiment, in response to at least one light source included in the at least one fourth photo conductive device being controlled by the processor 710, an electrical length of the at least one fourth photo conductive device can be determined and, by this, a phase for a plurality of antenna elements included in the fourth antenna module 774 can be adjusted (or shifted). The memory 750 can store a setting value for the at least one light source included in the at least one fourth photo conductive device. On the basis of the setting value, the processor 710 can control the at least one light source.

According to an embodiment, control signals for the photo conductive devices can be forwarded to the antenna modules 771, 772, 773 and 774 through the electrical connection members 781, 782, 783 and 784. According to some embodiment, separate conductive paths for forwarding the control signals for the photo conductive devices can be prepared as well.

According to an embodiment, the memory 750 can store codebook information about beamforming. On the basis of the codebook information, the processor 710 or the second wireless communication module 722 can efficiently allocate or dispose many beams through a plurality of antenna elements of the antenna modules 771, 772, 773 and 774.

According to various embodiments, the electronic device 700 can include at least one photo conductive device (e.g., the photo conductive device 430 of FIG. 5 or the photo conductive device 630 of FIG. 6A) which is connected in parallel or in series to a conductive path connecting the first wireless communication module 721 and the one or more antennas 740. The processor 710 or the wireless communication module 720 can control at least one light source included in at least one photo conductive device on the basis of the setting value stored in the memory 750.

According to various embodiments, the first wireless communication module 721 and/or the second wireless communication module 722 can form one module, together with the processor 710. For example, the first wireless communication module 721 and/or the second wireless communication module 722 can be integrally formed together with the processor 710. According to some embodiment, the first wireless communication module 721 and/or the second wireless communication module 722 can be disposed within one chip, or be formed in an independent chip form.

According to an embodiment, the processor 710 and one wireless communication module (e.g., the first wireless communication module 721) can be integrally formed within one chip (SoC chip), and the other wireless communication module (e.g., the second wireless communication module 722) can be formed in an independent chip form.

Figure 8:
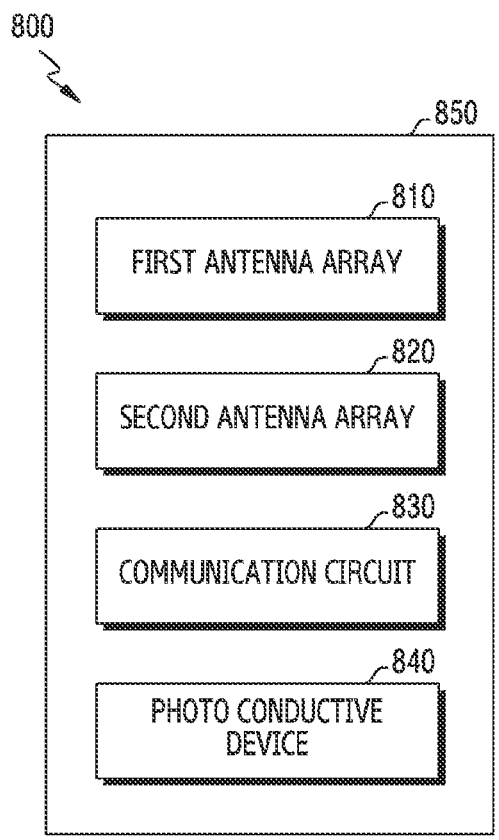
FIG. 8 is a block diagram of an antenna module according to an embodiment.

FIG. 8 is a block diagram of an antenna module according to an embodiment.

Referring to FIG. 8, the antenna module 800 (e.g., the first antenna module 771, the second antenna module 772, the third antenna module 773 or the fourth antenna module 774 of FIG. 7) can include at least one of a first antenna array 810, a second antenna array 820, a communication circuit 830, at least one photo conductive device 840, or a printed circuit board 850.

According to an embodiment, at least one of the first antenna array 810, the second antenna array 820, the communication circuit 830, or the at least one photo conductive device 840 can be disposed in the printed circuit board 850. For example, the first antenna array 810 or the second antenna array 820 can be disposed in a first surface of the printed circuit board 850, and the communication circuit 830 can be disposed in a second surface (e.g., a surface facing away from the first surface) of the printed circuit board 850. For example, the at least one photo conductive device 840 can, like the photo conductive device 530 of FIG. 5A or the photo conductive device 630 of FIG. 6A, be formed by using a portion of the printed circuit board 850.

According to an embodiment, the printed circuit board 850 can be electrically connected to another printed circuit board (e.g., a printed circuit board in which the wireless communication module 720 of FIG. 7 is disposed) by using an electrical connection member (e.g., the electrical connection member 781, 782, 783 or 784 of FIG. 7). According to an embodiment, the electrical connection member can be used for forwarding of an intermediate (IF) signal or a radio frequency (RF) signal for transmission and reception in a corresponding network (e.g., a 5G network). Through the electrical connection member, a power source or other control signals can be forwarded. For example, a processor (e.g., the processor 710 of FIG. 7) or a wireless communication module (e.g., the second wireless communication module 722 of FIG. 7) can transmit a signal controlling at least one light source included in the at least one photo conductive device 840, to the antenna module 800 through the electrical connection member.

According to an embodiment, the first antenna array 810 or the second antenna array 820 can be a structure in which antennas (or antenna elements) of the generally same form are arrayed plurally or in which a plurality of antenna elements are arrayed at a specific interval. According to an embodiment, the plurality of antenna elements included in the first antenna array 810 or the second antenna array 820, for example, can include a patch antenna, a loop antenna, or a dipole antenna. For example, at least a portion of the plurality of antenna elements included in the first antenna array 810 can include a patch antenna in order to form a beam toward a back plate of an electronic device (e.g., the electronic device 101 of FIG. 1). For example, at least a portion of the plurality of antenna elements included in the second antenna array 820 can include a dipole antenna or a loop antenna in order to form a beam toward a lateral member of the electronic device (e.g., a member forming a lateral surface of the electronic device).

According to an embodiment, in response to the at least one light source included in the at least one photo conductive device 840 being controlled by the processor (e.g., the processor 710 of FIG. 7 or the communication circuit 830), an electrical length of the at least one photo conductive device 840 can be determined and, by this, a phase for the plurality of antenna elements included in the first antenna array 810 or the second antenna array 820 can be determined.

According to an embodiment, the communication circuit 830 can transmit and/or receive a second signal of at least a partial band (e.g., a frequency band between about 24 GHz to about 100 GHz, a frequency band between about 24 GHz to about 30 GHz, or a frequency band between about 37 GHz to about 40 GHz) among about 6 GHz to about 100 GHz bands. According to an embodiment, the communication circuit 830 can up-convert or down-convert a frequency of a signal which is transmitted and/or received in wireless communication. For example, the communication circuit 830 can receive an intermediate frequency (IF) signal received through an electrical connection member (e.g., the electrical connection member 781, 782, 783 or 784 of FIG. 7) from a communication module (e.g., the wireless communication module 720 of FIG. 7), and up-convert the received IF signal into a radio frequency (RF) signal. For example, the communication circuit 830 can down-convert an RF signal (e.g., a millimeter wave signal) received through the plurality of antenna elements included in the first antenna array 810 or the second antenna array 820, into an IF signal. The IF signal can be offered to the communication module (e.g., the wireless communication module 720 of FIG. 7).

Figure 9:
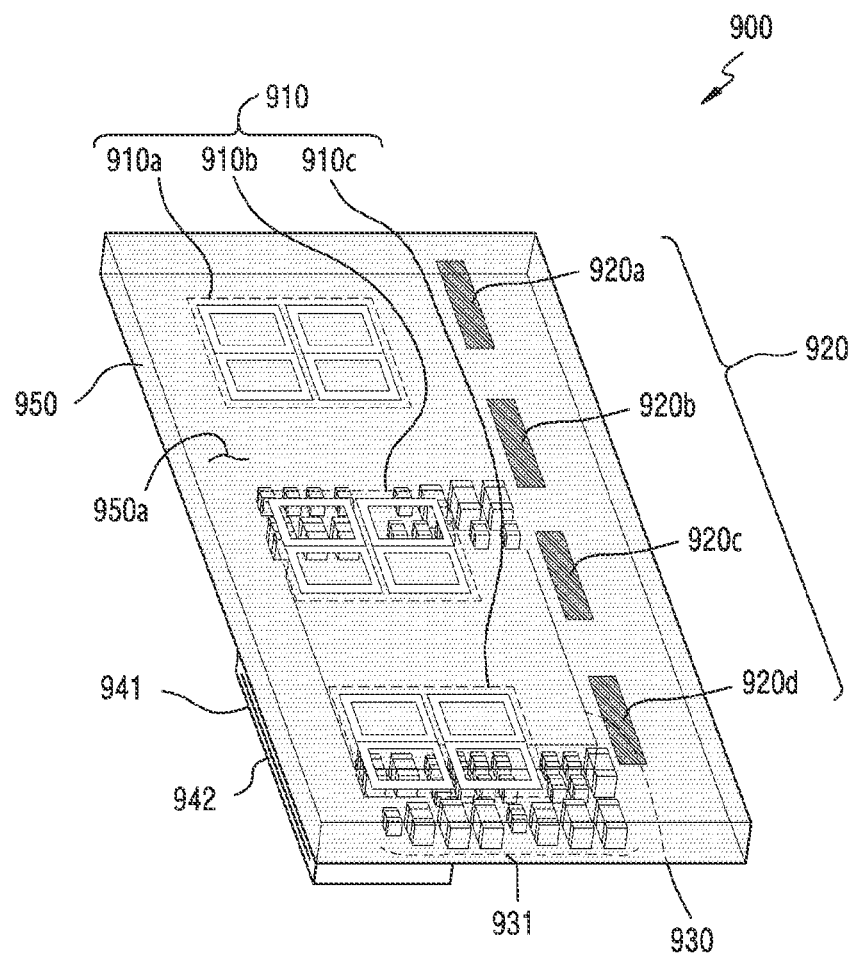
FIG. 9 is a perspective view of an antenna module according to an embodiment.

FIG. 9 is a perspective view of an antenna module according to an embodiment.

Referring to FIG. 9, the antenna module (or an antenna structure) 900 (e.g., the antenna module 800 of FIG. 8) can include a first antenna array 910 (e.g., the first antenna array 810 of FIG. 8), a second antenna array 920 (e.g., the second antenna array 820 of FIG. 8), a communication circuit 930 (e.g., the communication circuit 830 of FIG. 8), or a printed circuit board 950 (e.g., the printed circuit board 850 of FIG. 8).

According to an embodiment, the first antenna array 910 or the second antenna array 920 can be disposed in a first surface 950a of the printed circuit board 950, and the communication circuit 930 or various electrical devices (e.g., passive devices or active devices) 931 regarding this can be disposed in a second surface (e.g., a surface facing away from the first surface 950a) of the printed circuit board 950.

According to some embodiment, the first antenna array 910 or the second antenna array 920 can be implemented by a circuit included in an inner layer of the printed circuit board 950 as well. The first antenna array 910 or the second antenna array 920 can be electrically connected to the communication circuit 930 through a circuit (or wiring) of at least one inner layer included in the printed circuit board 950.

According to an embodiment, the printed circuit board 950 can include a structure including inner layers in which a circuit is formed by using copper clad laminates (CCL), a first outer layer and a second outer layer which are disposed at both sides of the inner layers and in which a circuit is formed, and prepregs which bond and insulate between the layers. A circuit between the layers can be electrically connected through a via formed in the printed circuit board 950. According to an embodiment, a circuit included in the first outer layer can include the first antenna array 910 or the second antenna array 920, and a circuit included in the second outer layer can include pads (or terminals) for mounting the communication circuit 930 by using a conductive material such as a solder.

According to some embodiment, by using a separately coated conductive paint, the first antenna array 910 or the second antenna array 920 can be formed in a metal plate printed circuit board 640 separately attached to the printed circuit board 950 as well.

According to an embodiment, the first antenna array 910 or the second antenna array 920, for example, can overcome a high free space loss and enhance an antenna gain, because of frequency characteristics, in wireless communication which uses a millimeter wave of about 20 GHz or more. The number of antenna elements is not limited to an illustrated example, and can become different in consideration of a size of the printed circuit board 950 or the antenna gain.

According to an embodiment, antenna elements 910a, 910b and 910c included in the first antenna array 910 can include a patch antenna, and antenna elements 920a, 920b, 920c and 920d included in the second antenna array 920 can include a dipole antenna or a loop antenna. According to an embodiment, in response to the antenna module 900 being mounted in an electronic device (e.g., the electronic device 101 of FIG. 1 or 2), the first antenna array 910 can form a beam towards a back plate of the electronic device, and the second antenna array 920 can form a beam towards a side bezel structure of the electronic device (e.g., a lateral member forming a lateral surface of the electronic device).

According to an embodiment, the antenna module 900 can include a beamforming system which processes a transmitted or received signal wherein energy radiated from the antenna element is concentrated in a specific direction in a space. The beamforming system can allow to receive a signal of a greater intensity in a desired direction or forward a signal in a desired direction, or allow not to receive a signal coming from an undesired direction. The beamforming system can adjust a form and direction of a beam by using a difference of an amplitude or phase of a carrier signal at an RF band. According to an embodiment, the beamforming system can include one or more photo conductive devices (e.g., the photo conductive device 330 of FIG. 4, the photo conductive device 530 of FIG. 5A, the photo conductive device 630 of FIG. 6A, or the photo conductive device 840 of FIG. 8) adjusting a phase for each antenna element. According to an embodiment, the beamforming system can control to have a phase difference for each antenna element. For example, when assuming that the antenna module includes a first antenna element and a second antenna element, the communication circuit 930 can include a first electrical path electrically connected to a first point on the first antenna element, and a second electrical path electrically connected to a second point on the second antenna element. By using the one or more photo conductive devices, the communication circuit 930 can offer a phase difference between a first signal at the first point and a second signal at the second point.

According to various embodiments, one of the first antenna array 910 and the second antenna array 920 can be omitted as well.

According to various embodiments, the printed circuit board 950 can include an antenna matching circuit. A radiation characteristic and impedance of the first antenna array 910 or the second antenna array 920 can be related to antenna performance, and be various according to a shape and size of an antenna element and a material of the antenna element. The radiation characteristic of the antenna element can include an antenna radiation pattern (or an antenna pattern) being a directive function indicating a relative distribution of power radiated from the antenna element, and a polarization state (or antenna polarization) of an electromagnetic wave radiated from the antenna element. The impedance of the antenna element can be related to power forwarding from a transmitter to the antenna element or power forwarding from the antenna element to a receiver. To minimize reflection in a connection portion between a transmission line and the antenna element, the impedance of the antenna element is designed to match with the impedance of the transmission line and, due to this, maximal power forwarding (or power loss minimization) or efficient signal forwarding through the antenna element can be possible. The impedance matching can lead to an efficient signal flow at a specific frequency (or a resonance frequency). Impedance mismatching can decrease a power loss or a transmitted and/or received signal and deteriorate communication performance. According to an embodiment, as a frequency adjusting circuit for solving this impedance mismatching, at least one device 931 mounted in the printed circuit board 950 can be used. According to an embodiment, the frequency adjusting circuit can move a resonance frequency to a specified frequency, or move the resonance frequency as much as specified.

According to an embodiment, the at least one device 931 can include a photo conductive device (e.g., the photo conductive device 330 of FIG. 4, the photo conductive device 530 of FIG. 5A, the photo conductive device 630 of FIG. 6A, or the photo conductive device 840 of FIG. 8). In response to at least one light source included in the photo conductive device being controlled, an electrical length of the photo conductive device can be determined and, due to this, impedance matching or phase shift for the antenna elements 910a, 910b, 910c, 920a, 920b, 920c or 920d can be conducted.

According to various embodiments, a signal (e.g., a signal for controlling the at least one light source of the photo conductive device) related to wireless communication, power or other various functions can be forwarded from another printed circuit board (e.g., a printed circuit board in which the processor 710 or the wireless communication module 720 of FIG. 7 is disposed) through an electrical connection member (e.g., the electrical connection member 781, 782, 783 or 784 of FIG. 7), and one or more devices mounted in the printed circuit board 950 can include passive devices or active devices related to this signal transmission and/or reception.

Figure 10:
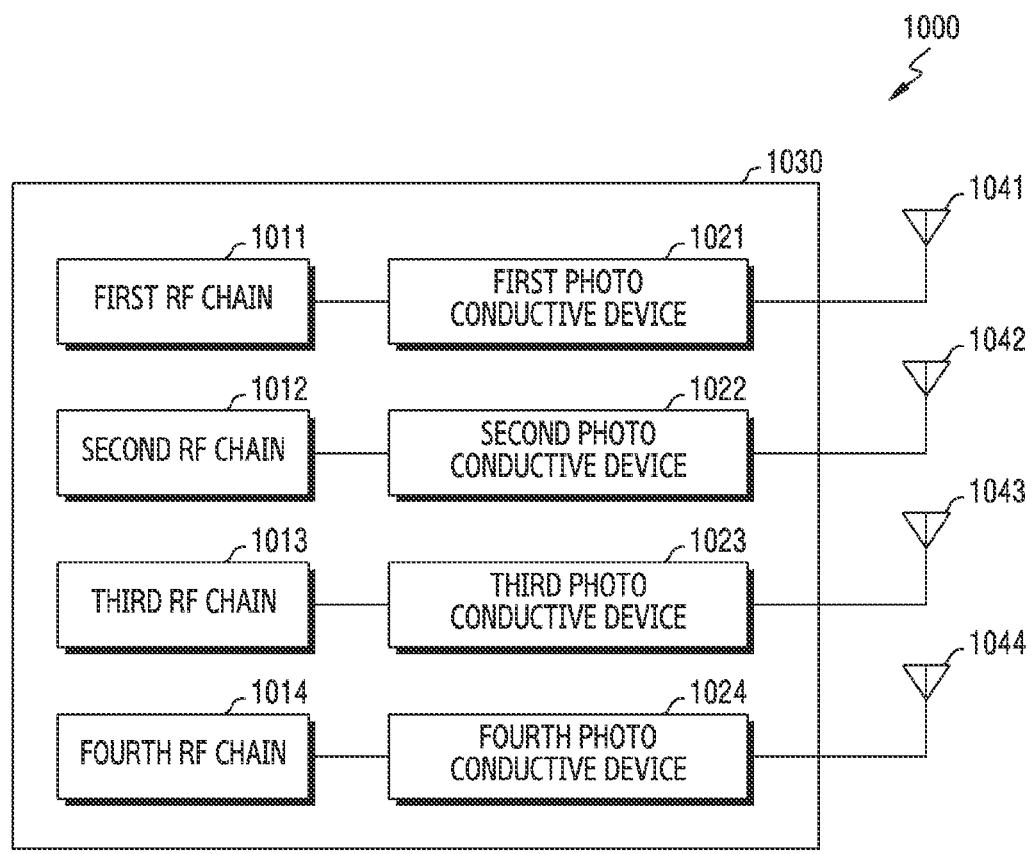
FIG. 10 is a block diagram of an antenna module according to an embodiment.

FIG. 10 is a block diagram of an antenna module according to an embodiment.

Referring to FIG. 10, in an embodiment, the antenna module 1000 (e.g., the antenna module 800 of FIG. 8 or the antenna module 900 of FIG. 9) can include at least one of a communication circuit 1030, a first antenna element 1041, a second antenna element 1042, a third antenna element 1043, or a fourth antenna element 1044.

According to an embodiment, the first antenna element 1041 can be electrically connected in a single feeding scheme with the communication circuit 1030 through a first RF chain 1011 (e.g., a first transmission line). The second antenna element 1042 can be electrically connected in the single feeding scheme with the communication circuit 1030 through a second RF chain 1012 (e.g., a second transmission line). The third antenna element 1043 can be electrically connected in the single feeding scheme with the communication circuit 1030 through a third RF chain 1013 (e.g., a third transmission line). The fourth antenna element 1044 can be electrically connected in the single feeding scheme with the communication circuit 1030 through a fourth RF chain 1014 (e.g., a fourth transmission line).

According to an embodiment, the antenna module 1000 can include a first photo conductive device 1021 being electrically connected with the first RF chain 1011 and for determining a phase of the first antenna element 1041. The antenna module 1000 can include a second photo conductive device 1022 being electrically connected with the second RF chain 1012 and for determining a phase of the second antenna element 1042. The antenna module 1000 can include a third photo conductive device 1023 being electrically connected with the third RF chain 1013 and for determining a phase of the third antenna element 1043. The antenna module 1000 can include a fourth photo conductive device 1024 being electrically connected with the fourth RF chain 1014 and for determining a phase of the fourth antenna element 1044. According to an embodiment, at least one of the first photo conductive device 1021, the second photo conductive device 1022, the third photo conductive device 1023 or the fourth photo conductive device 1024 can include the photo conductive device 330 of FIG. 4, the photo conductive device 530 of FIG. 5A, or the photo conductive device 630 of FIG. 6A.

For example, in response to at least one light source included in the first photo conductive device 1021 being controlled, the first antenna element 1041 can be fed to have a specified phase through the first RF chain 1011. In response to at least one light source included in the second photo conductive device 1022 being controlled, the second antenna element 1042 can be fed to have a specified phase through the second RF chain 1012. In response to at least one light source included in the third photo conductive device 1023 being controlled, the third antenna element 1043 can be fed to have a specified phase through the third RF chain 1013. In response to at least one light source included in the fourth photo conductive device 1024 being controlled, the fourth antenna element 1044 can be fed to have a specified phase through the fourth RF chain 1014. In response to electrical lengths of the photo conductive devices 1021, 1022, 1023 and 1024 being determined by controlling the light sources, the phases for the antenna elements 1041, 1042, 1043 and 1044 can be determined and a set beamforming which uses the antenna module 1000 can be implemented.

Figure 11:
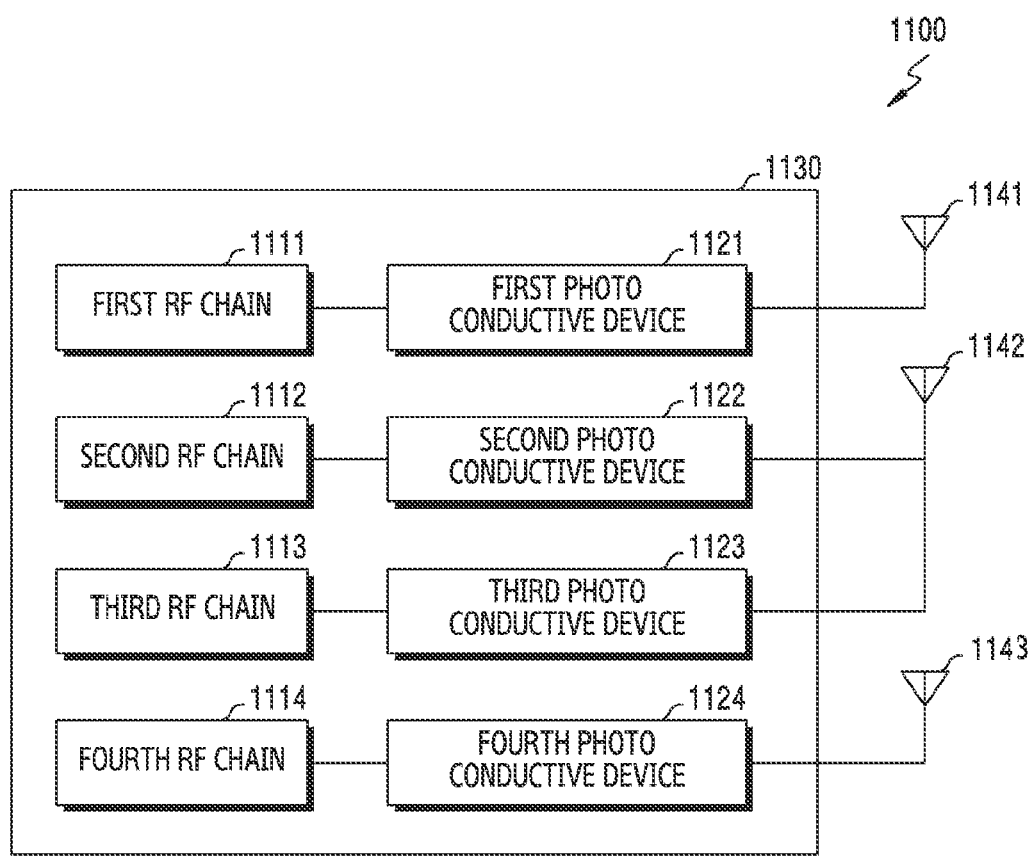
FIG. 11 is a block diagram of an antenna module according to an embodiment.

FIG. 11 is a block diagram of an antenna module according to an embodiment.

Referring to FIG. 11, in an embodiment, the antenna module 1100 (e.g., the antenna module 800 of FIG. 8 or the antenna module 900 of FIG. 9) can include at least one of a communication circuit 1130, a first antenna element 1141, a second antenna element 1142, a third antenna element 1143, or a fourth antenna element 1144.

According to an embodiment, the first antenna element 1141 can be electrically connected in a single feeding scheme with the communication circuit 1130 through a first RF chain 1111. The second antenna element 1142 can be electrically connected in the single feeding scheme with the communication circuit 1130 through a second RF chain 1112 and a third RF chain 1113. The fourth antenna element 1144 can be electrically connected with in the single feeding scheme the communication circuit 1130 through a fourth RF chain 1114.

According to an embodiment, the antenna module 1100 can include a first photo conductive device 1121 being electrically connected with the first RF chain 1111 and for determining a phase of the first antenna element 1141. The antenna module 1100 can include a second photo conductive device 1122 being electrically connected with the second RF chain 1112 and for determining a phase of the second antenna element 1142, and a third photo conductive device 1123 being electrically connected with the third RF chain 1113 and for determining a phase of the second antenna element 1142. The antenna module 1100 can include a fourth photo conductive device 1124 being electrically connected with the fourth RF chain 1114 and for determining a phase of the fourth antenna element 1144. According to an embodiment, at least one of the first photo conductive device 1121, the second photo conductive device 1122, the third photo conductive device 1123 or the fourth photo conductive device 1124 can include the conductive device 330 of FIG. 4, the photo conductive device 530 of FIG. 5A, or the photo conductive device 630 of FIG. 6A.

For example, in response to at least one light source included in the first photo conductive device 1121 being controlled, the first antenna element 1141 can be fed to have a specified phase through the first RF chain 1111. In response to at least one light source included in the second photo conductive device 1122 being controlled, the second antenna element 1142 can be fed to have a specified phase through the second RF chain 1112. In response to at least one light source included in the third photo conductive device 1123 being controlled, the third antenna element 1143 can be fed to have a specified phase through the third RF chain 1113. In response to at least one light source included in the fourth photo conductive device 1124 being controlled, the fourth antenna element 1144 can be fed to have a specified phase through the fourth RF chain 1114. In response to electrical lengths of the photo conductive devices 1121, 1122, 1123 and 1124 being determined by controlling the light sources, the phases for the antenna elements 1141, 1142, 1143 and 1143 can be determined and a set beamforming which uses the antenna module 1100 can be implemented.

Figure 12:
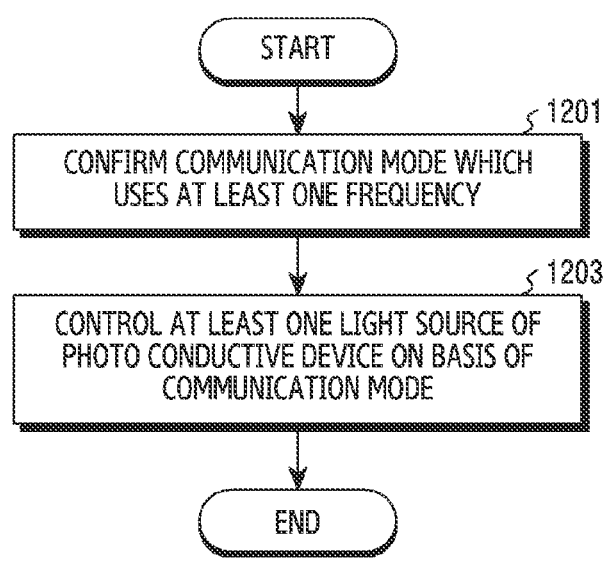
FIG. 12 illustrates a flowchart of an operation of an electronic device according to an embodiment.

FIG. 12 illustrates a flowchart of an operation of an electronic device (e.g., the electronic device 101 of FIG. 1 or 2, or the electronic device 700 of FIG. 7) according to an embodiment.

Referring to FIG. 12, in an embodiment, in operation 1201, the processor (e.g., the processor 120 of FIG. 1 or 2, or the processor 710 of FIG. 7) can confirm a communication mode which uses at least one frequency.

According to an embodiment, in operation 1203, the processor can control at least one light source of a photo conductive device (e.g., the photo conductive device 330 of FIG. 3, the photo conductive device 530 of FIG. 5A, or the photo conductive device 630 of FIG. 6A) on the basis of the confirmed communication mode. The processor can control at least one light source of the photo conductive device wherein the photo conductive device has a characteristic corresponding to the confirmed communication mode.

According to an embodiment, a memory (e.g., the memory 130 of FIG. 1 or 2, the memory 350 of FIG. 3, or the memory 750 of FIG. 7) can store instructions of allowing the processor to control the at least one light source of the photo conductive device correspondingly to the communication mode. For example, the memory can include an instruction of selectively activating at least one light source among a plurality of light sources of mutually different locations of the photo conductive device correspondingly to the communication mode.

According to an embodiment, the memory 750 can store a setting value for the at least one light source of the photo conductive device correspondingly to each communication mode. The setting value for the at least one light source included in the photo conductive device can be a value which is determined through RF calibration in order to implement impedance matching or set beamforming in the corresponding communication mode. According to some embodiment, by allowing an external device on RF calibration to access the memory, the setting value for the at least one light source can be directly stored or updated in the memory.

According to an embodiment, the processor can control at least one light source of a photo conductive device on the basis of a setting value for the at least one light source stored in the memory, in a corresponding communication mode. According to an embodiment, in response to the at least one light source of the photo conductive device being controlled, an electrical length of the photo conductive device can be determined. The determined electrical length of the photo conductive device can shift a phase of an RF signal supplied to at least one antenna (e.g., at least one antenna 340 of FIG. 3) connected to a transmission line (e.g., the transmission line 360 of FIG. 3), or move a resonance frequency of the at least one antenna to a specified frequency or move as much as specified. According to various embodiments, the electrical length can be various according to a physical length of a conductive pattern capable of being formed by the photo conductive device, a width, or its form. According to various embodiments, operation 1203 can include the operation of controlling the photo conductive device wherein various conductive patterns connected to a transmission line are formed, according to a communication mode which uses a corresponding frequency band. According to an embodiment, the memory can include an instruction of allowing the processor to control a light source of a photo conductive device on the basis of first control information in a first communication mode which uses a first frequency. According to an embodiment, the memory can include an instruction of allowing the processor to control the light source of the photo conductive device on the basis of second control information at least partially different from the first control information in a second communication mode which uses a second frequency different from the first frequency.

The direction (e.g., a main lobe) of a beam, for example, can be varied according to the same situation (or peripheral circumstances) as when a user carries an electronic device. According to an embodiment, the memory can store a setting value for at least one light source corresponding to the situation, and, on the basis of this, the processor can control at least one light source of the photo conductive device (e.g., the photo conductive device 330 of FIG. 4, the photo conductive device 530 of FIG. 5A, or the photo conductive device 630 of FIG. 6A) and optimize a signal to noise ratio (SNR) as well.

According to an embodiment, an electronic device (e.g., the electronic device 300 of FIG. 3) can include an antenna (e.g., at least one antenna 340 of FIG. 3), and a photo conductive device (e.g., the photo conductive device 330 of FIG. 3) electrically connected to the antenna. The photo conductive device can include a first layer (e.g., the first layer 410 of FIG. 4) including a plurality of conductive elements (e.g., the plurality of conductive elements 411 of FIG. 4) disposed to be spaced apart at a specified interval. The photo conductive device can include a second layer (e.g., the second layer 420 of FIG. 4) disposed above the first layer and including at least one light source (e.g., the plurality of light sources 421_1, 421_2, 421_3, . . . , 421_N of FIG. 4) capable of outputting light. The photo conductive device can include a third layer (e.g., the third layer 430 of FIG. 4) disposed between the first layer and the second layer, and having a photo conductive member (e.g., the photo conductive member 431 of FIG. 4) of which at least a portion can be changed, by means of the light, to be conductive, and electrically connect at least a portion of the plurality of conductive elements.

According to an embodiment, the electronic device can further include a wireless communication module (e.g., the wireless communication module 320 of FIG. 3) electrically connected to the antenna (e.g., the antenna 340 of FIG. 3). The photo conductive device can be electrically connected to a transmission line (e.g., the transmission line 360 of FIG. 3) between the antenna and the wireless communication module.

According to an embodiment, the portion changed to be conductive among the photo conductive member (e.g., the photo conductive member 431 of FIG. 4) and the at least portion of the plurality of conductive elements (e.g., the plurality of conductive elements 411 of FIG. 4) electrically connected by this can be used as a branch line connected in parallel to the transmission line (e.g., the transmission line 560 of FIG. 5A).

According to an embodiment, the portion changed to be conductive among the photo conductive member and the at least portion of the plurality of conductive elements 611 electrically connected by this can be used as a line connected in series to the transmission line (e.g., the transmission line 660 of FIG. 6A).

According to an embodiment, the antenna (e.g., the antenna 440 of FIG. 4) can be fed to have a specified phase through the wireless communication module (e.g., the wireless communication module 420 of FIG. 4) by the photo conductive device (e.g., the photo conductive device 430 of FIG. 4).

According to an embodiment, the photo conductive device (e.g., the photo conductive device 330 of FIG. 3) can move a resonance frequency of the antenna (e.g., the at least one antenna 340 of FIG. 3) to a specified frequency or move as much as specified.

According to an embodiment, the photo conductive member (e.g., the photo conductive member 531 of FIG. 5) can include a plurality of photo conductive elements (e.g., the plurality of photo conductive elements 531_1, 531_2, 531_3, . . . , 531_N of FIG. 5). At least a portion of the plurality of photo conductive elements can be changed, by means of the light, to be conductive, and electrically connect the at least portion of the plurality of conductive elements.

According to an embodiment, the first layer (e.g., the first layer 410 of FIG. 4) can further include a dielectric layer (e.g., the dielectric layer 413 of FIG. 4) including a first surface (e.g., the first surface 4131 of FIG. 4) in which the plurality of conductive elements (e.g., the plurality of conductive elements 411 of FIG. 4) are disposed, and a second surface (e.g., the second surface 4132 of FIG. 4) facing away from the first surface, and a ground plane (e.g., the ground plane 414 of FIG. 4) disposed in the second surface.

According to an embodiment, the plurality of conductive elements (e.g., the plurality of conductive elements 511 of FIG. 5A) can be disposed in matrix.

According to an embodiment, the photo conductive member (e.g., the photo conductive member 431 of FIG. 4) can include Si.

According to an embodiment, the at least one light source (e.g., the light source 421_N of FIG. 4) can include a light emitting diode (LED).

According to an embodiment, the electronic device can further include a bonding layer of a polymer material disposed between the second layer (e.g., the second layer 420 of FIG. 4) and the third layer (e.g., the third layer 430 of FIG. 4).

According to an embodiment, the electronic device can further include a processor (e.g., the processor 310 of FIG. 3) controlling the at least one light source on the basis of a communication mode which uses at least one frequency.

According to an embodiment, an electronic device (e.g., the electronic device 300 of FIG. 3) can include an antenna (e.g., the antenna 340 of FIG. 3), a wireless communication module (e.g., the wireless communication module 320 of FIG. 3) electrically connected to the antenna, and a photo conductive device (e.g., the photo conductive device 330 of FIG. 3) electrically connected to a transmission line (e.g., the transmission line 360 of FIG. 3) between the antenna and the wireless communication module. The photo conductive device can include a first layer (e.g., the first layer 410 of FIG. 4) including a plurality of conductive elements (e.g., the plurality of conductive elements 411 of FIG. 4) disposed to be spaced apart at a specified interval. The photo conductive device can include a second layer (e.g., the second layer 420 of FIG. 4) including, above the first layer, a plurality of light sources (e.g., the plurality of light sources 421_1, 421_2, 421_3, . . . , 421_N of FIG. 4) which are disposed correspondingly to the plurality of conductive elements. The photo conductive device can include a third layer (e.g., the third layer 430 of FIG. 4) disposed between the first layer and the second layer, and having a photo conductive member (e.g., the photo conductive member 431 of FIG. 4) of which at least a portion can be changed, by means of the light, to be conductive, and electrically connect at least a portion of the plurality of conductive elements.

According to an embodiment, the portion changed to be conductive among the photo conductive member (e.g., the photo conductive member 431 of FIG. 4) and the at least portion of the plurality of conductive elements (e.g., the plurality of conductive elements 411 of FIG. 4) electrically connected by this can be used as a branch line connected in parallel to the transmission line (e.g., the transmission line 560 of FIG. 5A).

According to an embodiment, the antenna (e.g., the at least one antenna 340 of FIG. 3) can be fed to have a specified phase through the wireless communication module (e.g., the wireless communication module 320 of FIG. 3) by the photo conductive device (e.g., the photo conductive device 330 of FIG. 3).

According to an embodiment, the electronic device can further include a processor (e.g., the processor 310 of FIG. 3) configured to selectively activate at least one light source among the plurality of light sources (e.g., the plurality of light sources 421_1, 421_2, 421_3, . . . , 421_N of FIG. 4) on the basis of the communication mode.

According to an embodiment, the processor can control at least one light source among the plurality of light sources (e.g., the plurality of light sources 421_1, 421_2, 421_3, . . . , 421_N of FIG. 4) on the basis of first control information in a first communication mode which uses a first frequency, and control at least one light source among the plurality of light sources on the basis of second control information at least partially different from the first control information in a second communication mode which uses a second frequency different from the first frequency.

According to an embodiment, a photo conductive device (e.g., the photo conductive device 330 of FIG. 4) can include a first layer (e.g., the first layer 410 of FIG. 4) including a plurality of conductive elements (e.g., the plurality of conductive elements 411 of FIG. 4) disposed to be spaced apart at a specified interval. The photo conductive device can include a second layer (e.g., the second layer 420 of FIG. 4) disposed above the first layer and including at least one light source (e.g., the plurality of light sources 421_1, 421_2, 421_3, . . . , 421_N of FIG. 4) capable of outputting light. The photo conductive device can include a third layer (e.g., the third layer 430 of FIG. 4) disposed between the first layer and the second layer, and having a photo conductive member (e.g., the photo conductive member 431 of FIG. 4) of which at least a portion can be changed, by means of the light, to be conductive, and electrically connect at least a portion of the plurality of conductive elements.

According to an embodiment, the at least one light source can include a plurality of light sources (e.g., the plurality of light sources 521_1, 521_2, 521_3, . . . , 521_N) arrayed in the plurality of photo conductive elements (e.g., the plurality of photo conductive elements 531_1, 531_2, 531_3, . . . , 531_N).

According to an embodiment, the third layer (e.g., the third layer 530 of FIG. 5) can further include an insulating member (e.g., the insulating member 532 of FIG. 5).

According to an embodiment, the insulating member (e.g., the insulating member 532 of FIG. 5) can include $SiO_2$.

According to an embodiment, the first layer (e.g., first layer 510 of FIG. 5) can include void spaces (e.g., the void spaces 512 of FIG. 5) between the plurality of conductive elements (e.g., the plurality of conductive elements 511 of FIG. 5).

According to an embodiment, the first layer (e.g., first layer 510 of FIG. 5) can further include an insulating material disposed in gaps between the plurality of conductive elements (e.g., the plurality of elements 511 of FIG. 5).

Embodiments disclosed in the specification and drawings merely suggest specific examples so as to easily explain technology content of an embodiment and help the understanding of the embodiment, and do not intend to limit the scope of the embodiment. Accordingly, the scope of various embodiments should be construed as including all modified or changed forms drawn on the basis of the technological spirit of the various embodiments, besides embodiments disclosed herein.

The invention claimed is:

1. An electronic device comprising:
an antenna; and
a photo conductive device electrically connected to the antenna,
wherein the photo conductive device comprises:
a first layer comprising a plurality of conductive elements disposed to be spaced apart at a specified interval;
a second layer disposed above the first layer and comprising at least one light source for outputting light; and
a third layer disposed between the first layer and the second layer, and having a photo conductive member of which at least a portion is changed, by means of the light, to be conductive, and electrically connects at least a portion of the plurality of conductive elements.

2. The electronic device of claim 1, further comprising: a wireless communication module electrically connected to the antenna,
wherein the photo conductive device is electrically connected to a transmission line between the antenna and the wireless communication module.

3. The electronic device of claim 2, wherein the portion changed to be conductive among the photo conductive member and the at least portion of the plurality of conductive elements electrically connected by this are used as a branch line connected in parallel to the transmission line.

4. The electronic device of claim 2, wherein the portion changed to be conductive among the photo conductive member and the at least portion of the plurality of conductive elements electrically connected by this are used as a line connected in series to the transmission line.

5. The electronic device of claim 2, wherein the antenna is fed to have a specified phase through the wireless communication module by the photo conductive device.

6. The electronic device of claim 2, wherein the photo conductive device moves a resonance frequency of the antenna to a specified frequency or moves as much as specified.

7. The electronic device of claim 1, wherein the photo conductive member comprises a plurality of photo conductive elements, and at least a portion of the plurality of photo conductive elements is changed, by means of the light, to be conductive, and electrically connects the at least portion of the plurality of conductive elements.

8. The electronic device of claim 1, wherein the first layer further comprises:
a dielectric layer comprising a first surface in which the plurality of conductive elements are disposed, and a second surface facing away from the first surface; and
a ground plane disposed in the second surface.

9. The electronic device of claim 1, wherein the plurality of conductive elements are disposed in matrix.

10. The electronic device of claim 1, further comprising a processor controlling the at least one light source on the basis of a communication mode which uses at least one frequency.

11. An electronic device comprising:
an antenna;
a wireless communication module electrically connected to the antenna; and
a photo conductive device electrically connected to a transmission line between the antenna and the wireless communication module,
wherein the photo conductive device comprises:
a first layer comprising a plurality of conductive elements disposed to be spaced apart at a specified interval;
a second layer comprising, above the first layer, a plurality of light sources which are disposed correspondingly to the plurality of conductive elements; and
a third layer disposed between the first layer and the second layer, and having a photo conductive member of which at least a portion is changed, by means of the light, to be conductive, and electrically connects at least a portion of the plurality of conductive elements.

12. The electronic device of claim 11, wherein the portion changed to be conductive among the photo conductive member and the at least portion of the plurality of conductive elements electrically connected by this are used as a branch line connected in parallel to the transmission line.

13. The electronic device of claim 11, wherein the antenna is fed to have a specified phase through the wireless communication module by the photo conductive device.

14. The electronic device of claim 11, further comprising a processor configured to selectively activate at least one light source among the plurality of light sources on the basis of the communication mode.

15. A photo conductive device comprising:
- a first layer comprising a plurality of conductive elements disposed to be spaced apart at a specified interval;
- a second layer disposed above the first layer and comprising at least one light source for outputting light; and
- a third layer disposed between the first layer and the second layer, and having a photo conductive member of which at least a portion is changed, by means of the light, to be conductive, and electrically connects at least a portion of the plurality of conductive elements.

* * * * *